US00RE41503E

(19) United States
(12) Reissued Patent
Aoki et al.

(10) Patent Number: US RE41,503 E
(45) Date of Reissued Patent: Aug. 17, 2010

(54) METHOD OF PRODUCING PLASMA DISPLAY PANEL WITH PROTECTIVE LAYER OF AN ALKALINE EARTH OXIDE

(75) Inventors: Masaki Aoki, Minoh (JP); Hideo Torii, Higashiosaka (JP); Eiji Fujii, Hirakata (JP); Mitsuhiro Ohtani, Sakai (JP); Takashi Inami, Suita (JP); Hiroyuki Kawamura, Katano (JP); Hiroyoshi Tanaka, Kyoto (JP); Ryuichi Murai, Toyonaka (JP); Yasuhisa Ishikura, Katano (JP); Yutaka Nishimura, Kadoma (JP); Katsuyoshi Yamashita, Katano (JP); Yasuko Nishimura, Kadoma (JP); Syunsuke Nishimura, Kadoma (JP); Emi Kawahara, Moriguchi (JP)

(73) Assignee: Panasonic Corporation, Osaka (JP)

(21) Appl. No.: 11/437,004

(22) Filed: May 18, 2006

Related U.S. Patent Documents

Reissue of:
(64) Patent No.: 5,993,543
Issued: Nov. 30, 1999
Appl. No.: 08/890,577
Filed: Jul. 9, 1997

(30) Foreign Application Priority Data

| | | |
|---|---|---|
| Dec. 15, 1995 | (JP) | 7-326766 |
| Feb. 1, 1996 | (JP) | 8-016326 |
| Jun. 24, 1996 | (JP) | 8-162639 |
| Aug. 26, 1996 | (JP) | 8-223428 |

(51) Int. Cl.
*C30B 29/16* (2006.01)
*C30B 23/00* (2006.01)

(52) U.S. Cl. ..... 117/88; 117/101; 117/103; 117/104; 117/944

(58) Field of Classification Search ..... 117/88, 117/101, 103, 104
See application file for complete search history.

(56) References Cited

U.S. PATENT DOCUMENTS 3,863,089 A 1/1975 Ernsthausen et al.

(Continued)

FOREIGN PATENT DOCUMENTS

EP 0 279 744 A1 8/1988

(Continued)

OTHER PUBLICATIONS

Tanaka et al.: "Vacuum–Ultra–Violet Eximer Light Emission in Xe/He, Xe/Ne, Xe/Ar, Xe/Kr Gas Mixture", IEEJ Meeting Papers, EP–96–23 pp. 1–10, May 9, 1996.

(Continued)

*Primary Examiner*—Robert M Kunemund

(57) ABSTRACT

The first object of the present invention is to provide a PDP with improved panel brightness which is achieved by improving the efficiency in conversion from discharge energy to visible rays. The second object of the present invention is to provide a PDP with improved panel life which is achieved by improving the protecting layer protecting the dielectrics glass layer. To achieve the first object, the present invention sets the amount of xenon in the discharge gas to the range of 10% by volume to less than 100% by volume, and sets the charging pressure for the discharge gas to the range of 500 to 760 Torr which is higher than conventional charging pressures. With such construction, the panel brightness increases. Also, to achieve the second object, the present invention has, on the surface of the dielectric glass layer, a protecting layer consisting of an alkaline earth oxide with (100)-face or (110)-face orientation. The protecting layer, which may be formed by using thermal Chemical Vapor Deposition (CVD) method, plasma enhanced CVD method, or a vapor deposition method with irradiation of ion or electron beam, will have a high sputtering resistance and effectively protect the dielectrics glass layer. Such a protecting layer contributes to the improvement of the panel life.

4 Claims, 9 Drawing Sheets

U.S. PATENT DOCUMENTS

| | | | |
|---|---|---|---|
| 3,916,245 | A | 10/1975 | Dorf et al. |
| 4,048,533 | A | 9/1977 | Hinson et al. |
| 4,198,585 | A | 4/1980 | Yamashita et al. |
| 4,320,418 | A | 3/1982 | Pavliscak |
| 4,419,605 | A | 12/1983 | Branston |
| 4,584,086 | A | 4/1986 | Hayakawa et al. |
| 4,717,584 | A | 1/1988 | Aoki et al. |
| 4,926,095 | A | 5/1990 | Shinoda et al. |
| 5,107,176 | A | 4/1992 | Endo et al. |
| 5,108,983 | A | 4/1992 | Lackey, Jr. et al. |
| 5,139,999 | A | 8/1992 | Gordon et al. |
| 5,179,318 | A | 1/1993 | Maeda et al. |
| 5,458,086 | A | 10/1995 | Smith et al. |
| 5,510,678 | A | 4/1996 | Sakai et al. |
| 5,559,403 | A | 9/1996 | Sakai et al. |
| 5,604,396 | A | 2/1997 | Watanabe et al. |
| 5,661,500 | A | 8/1997 | Shinoda et al. |
| 5,818,168 | A | 10/1998 | Ushifusa et al. |
| 5,844,362 | A | 12/1998 | Tanabe et al. |
| 6,160,345 | A | 12/2000 | Tanaka et al. |

FOREIGN PATENT DOCUMENTS

| | | | |
|---|---|---|---|
| EP | 0 364 068 | | 4/1990 |
| EP | 0 500 084 | | 8/1992 |
| EP | 0 566 997 | | 10/1993 |
| EP | 0 649 159 | A1 | 4/1995 |
| GB | 2 109 628 | A | 6/1983 |
| JP | 56038729 | | 4/1981 |
| JP | 61-287032 | | 12/1986 |
| JP | 1-104774 | | 4/1989 |
| JP | 01234398 | | 9/1989 |
| JP | 02149661 | | 6/1990 |
| JP | 3-230448 | | 10/1991 |
| JP | 04-010330 | | 1/1992 |
| JP | 5-144378 | | 6/1993 |
| JP | 5-205642 | | 8/1993 |
| JP | 05234519 | | 9/1993 |
| JP | 5-342991 | | 12/1993 |
| JP | 06-325696 | | 11/1994 |
| JP | 6-342631 | | 12/1994 |
| JP | 07300397 | | 11/1995 |
| JP | 08-111177 | | 4/1996 |
| JP | 2001-104774 | | 4/2001 |
| JP | 2004-170394 | | 6/2004 |
| KR | 90-008640 | | 11/1990 |
| WO | WO 94/28570 | | 12/1994 |
| WO | 95/19027 | | 7/1995 |
| WO | 96/32520 | | 10/1996 |

OTHER PUBLICATIONS

Fujii, E. et al, "NaCI–type Oxide Films Prepared by Plasma–Enhanced Metalorganic Chemical Vapor Deposition", Japanese Journal of Applied Physics, Part 2 (letters), vol. 32, No. 10A, L1448–L1450, Oct. 1, 1993.

Matthews, Epitaxial Growth Part A, Academic Press 1975 New York, pp. 91–99.

Vossen et al., Thin Film Processes, Academic Press New York, 1978, pp. 340–341.

2.2 Discharge Gas, Optical Techniques Contact, Vo. 34, No. 1, 1996 (with partial English translation).

M. Yokozawa et al., "Study on Ultraviolet Radiation of Rare Gas in a Gas–Discharge Display Panel", NHK Techniques Study, 31–1, 1979 (with partial English translation).

Flat Panel Display '96, Part S–3 (with partial English translation).

J. Koike, Fluorescent Substance for Color Plasma Display Panel, O Plus E, No. 195, 1996.

T. Shinoda et al.; Low–Voltage Operated AC Plasma–Display Panels; IEEE Transactions On Electron Devices, Vo. ED–26, No. 8, Aug. 1979.

K.C. Park et al., E–Beam Evaporated Glass and MGO Layers for Glass Panel Fabrication; IBM J. Res. Develop., vol. 22, No. 6, Nov. 1978.

M. Noborio et al.; 33.4: (He, Ne)–Xe Gas Mixtures for High–Luminance Color AC PDP; SID 94 Digest 727.

Specification and Characteristics of Recent Color PDP; Function & Materials, Feb. 1996, vol. 16, No. 2 (with partial English Translation).

Y. Okamoto; State and Problems of Gas Discharge Display; Applied Physics, vol. 51, No. 3, 1982 (with partial English translation).

Ichiro Koiwa Takao Kanehara et al., Preparation of MGO Protective Layer for AC–Type Plasma Display Panel by Means of Screen–Printing, Journal of the Electrochemical Society, Manchester, New Hampshire, US, vol. 142, No. 5, May 1, 1995, pp. 1396–1401.

M. Berkenbilt et al., Fabrication Process for Gas Discharge Panels, IBM Technical Disclosure Bulletin, vol. 18, No. 6, Nov. 1975, 2 pages.

METHOD OF PRODUCING PLASMA DISPLAY PANEL WITH PROTECTIVE LAYER OF AN ALKALINE EARTH OXIDE

Matter enclosed in heavy brackets [ ] appears in the original patent but forms no part of this reissue specification; matter printed in italics indicates the additions made by reissue.

*CROSS-REFERENCE TO RELATED APPLICATIONS*

[This is a divisional application of Ser. No. 08/766,030, filed on Dec. 16, 1996, now issued as U.S. Pat. No. 5,770, 921.] *This is a divisional application of U.S. Ser. No. 09/997, 536, filed on Nov. 29, 2001 which is a reissue application of U.S. Pat. No. 5,993,543 issued on Nov. 30, 1999 which is a divisional application of U.S. Pat. No. 5,770,921 issued on Jun. 23, 1998.*

BACKGROUND OF THE INVENTION (1) Field of the Invention

This invention relates to a plasma display panel used as a display device and the method of producing the display panel, specifically to a plasma display panel suitable for a high-quality display.

(2) Description of the Prior Art

Recently, as the demand for high-quality large-screen TVs such as high-vision TVs have increased, displays suitable for such TVs, such as Cathode Ray Tube (CRT), Liquid Crystal Display (LCD), and Plasma Display Panel (PDP), have been developed.

CRTs have been widely used as TV displays and excel in resolution and picture quality. However, the depth and weight increase as the screen size increases. Therefore, CRTs are not suitable for large screen sizes exceeding 40 inch. LCDs consume a small amount of electricity and operate on a low voltage. However, producing a large LCD screen is technically difficult, and the viewing angles of LCDs are limited.

On the other hand, it is possible to make a PDP with a large screen with a short depth, and 40-inch PDP products have already been developed.

PDPs are divided into two types: Direct Current (DC) and Alternating Current (AC). Currently, PDPs are mainly AC-type since they are suitable for large screens.

FIG. 1 is a sectional view of a conventional AC PDP. In the drawing, front cover plate 1, with display electrodes 2 put thereon, is covered by dielectric glass layer 3 which is lead glass, namely, $PbO$-$B_2O_3$-$SiO_2$ glass.

Set on back plate 5 are address electrode 6, partition walls 7, and fluorescent substance layer 8 consisting of red, green, or blue ultraviolet excited fluorescent substance. Discharge gas is charged in discharge space 9 which is sealed with dielectrics glass layer 3, back plate 5, and partition walls 7.

The discharge gas is generally helium (He), xenon (Xe), or mixture of neon (Ne) and Xe. The amount of Xe is generally set to a range from 0.1 to 5% by volume, preventing the drive voltage of the circuit from becoming too high.

Also, the charging pressure of the discharge gas is generally set to a range from 100 to 500 Torr so that the discharge voltage is stable (e.x., M. Nobrio, T. Yoshioka, Y. Sano, K. Nunomura, SID94' Digest, pp 727–730, 1994).

PDPs have the following problems concerning brightness and life.

Currently, PDPs for 40–42-inch TV screens generally have a brightness of about 150–250 cd/m$^2$ for National Television System Committee (NTSC) standard (number of pixels being 640×480, cell pitch 0.43 mm×1.29 mm, square of one cell 0.55 mm$^2$) (Function & Materials, Feb., 1996, Vol. 16, No. 2, page 7).

On the contrary, in 42-inch high-vision TVs, number of pixels is 1,920×1,125, cell pitch 0.15 mm×0.48 mm, and square of one cell 0.072 mm$^2$. This square of one cell is 1/7–1/8 of that of NTSC standard. Therefore, it is expected that if PDP for 42-inch high-vision TV is made with the conventional cell construction, the screen brightness decreases to 30–40 cd/m$^2$.

Accordingly, to acquire, in a PDP used for a 42-inch high-vision TV, the same brightness as that of a current NTSC CRT (500 cd/m$^2$), the brightness of each cell should be increased about 12–15 times.

In these circumstances, it is desired that the techniques for increasing the brightness of PDP cells are developed.

The light-emission principle in PDP is basically the same as that in fluorescent light: a discharge lets the discharge gas emit ultraviolet light; the ultraviolet light excites fluorescent substances; and the excited fluorescent substances emit red, green, and blue lights. However, since discharge energy is not effectively converted to ultraviolet light and conversion ratio in fluorescent substance is low, it is difficult for PDPs to provide brightness as high as that of fluorescent lights.

It is disclosed in Applied Physics, Vol. 51, No. 3, 1982, pp. 344–347 as follows: in PDP with He-Xe or Ne-Xe gas, only about 2% of the electric energy is used in ultraviolet light, and about 0.2% of the electric energy is used in visible rays (Optical Techniques Contact, Vol. 34, No. 1, 1996, page 25 and FLAT PANEL DISPLAY 96, Parts 5-3, NHK Techniques Study, 31-1, 1979, page 18).

Accordingly, to increase light-emission efficiency is considered as important in increasing the brightness of PDP cells.

Now, regarding to the PDP life, the following are generally considered to determine the PDP life: (1) the fluorescent substance layer deteriorates since plasma is confined to a small discharge space to generate ultraviolet light; and (2) the dielectrics glass layer deteriorates due to sputtering by gas discharges. As a result, methods for extending the fluorescent substance life or preventing the deterioration of dielectric glass layer are studied.

As shown in FIG. 1, in conventional PDPs, protecting layer 4 consisting of magnesium oxide (MgO) is formed on the surface of dielectrics glass layer 3 with a vacuum vapor deposition method to prevent the dielectrics glass layer from deteriorating.

It is desirable that protecting layer 4 has high sputtering resistance and emits a large amount of secondary electrons. However, it is difficult for a magnesium oxide layer formed by the vacuum vapor deposition method to obtain a protective layer having enough sputtering resistance. There is also a problem that discharges decrease the amount of secondary electron emitted.

SUMMARY OF THE INVENTION

It is therefore the first object of the present invention to provide a PDP with improved panel brightness which is achieved by improving the efficiency in conversion from discharge energy to visible rays. It is the second object of the present invention to provide a PDP with improved panel life which is achieved by improving the protecting layer protecting the dielectric glass layer.

To achieve the first object, the present invention sets the amount of Xe in the discharge gas to the range of 10% by volume to less than 100% by volume, and sets the charging pressure for the discharge gas to the range of 500 to 760 Torr which is higher than conventional charging pressures. With such construction, the panel brightness increases. The assumed reasons for it are as follows: the increase In the amount of Xe in the discharge space increases the amount of ultraviolet light emitted; the ratio of excitation wavelength (173 nm of wavelength) by molecular beam of Xe molecules In the emitted ultraviolet light increases; and this increases the efficiency of a conversion from fluorescent substance to visible rays.

Also, to achieve the second object, the present invention has, on the surface of the dielectrics glass layer, a protecting layer consisting of an alkaline earth oxide with (100)-face or (110)-face orientation.

The conventional protecting layer of magnesium oxide formed by vacuum vapor deposition method (electron-beam evaporation method) has (111)-crystal-face orientation. Compared to this, the protecting layer of an alkaline earth oxide with (100)-face or (110)-face orientation is dense, has high sputtering resistance, and emits a great amount of secondary electrons.

Accordingly, the present invention prevents deterioration of the dielectric glass layer and keeps the discharge voltage low.

Also, such effects are further improved by using thermal Chemical Vapor Deposition (CVD) method or plasma enhanced CVD method, both of which have not been used as methods of forming protecting layers, to form an alkaline earth oxide with (100)-face orientation.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

Tables 1–4 processing conditions and PDP characteristics.

DESCRIPTION OF THE PREFERRED EMBODIMENTS

Embodiment 1

Structure and Production Method

Figure 1:
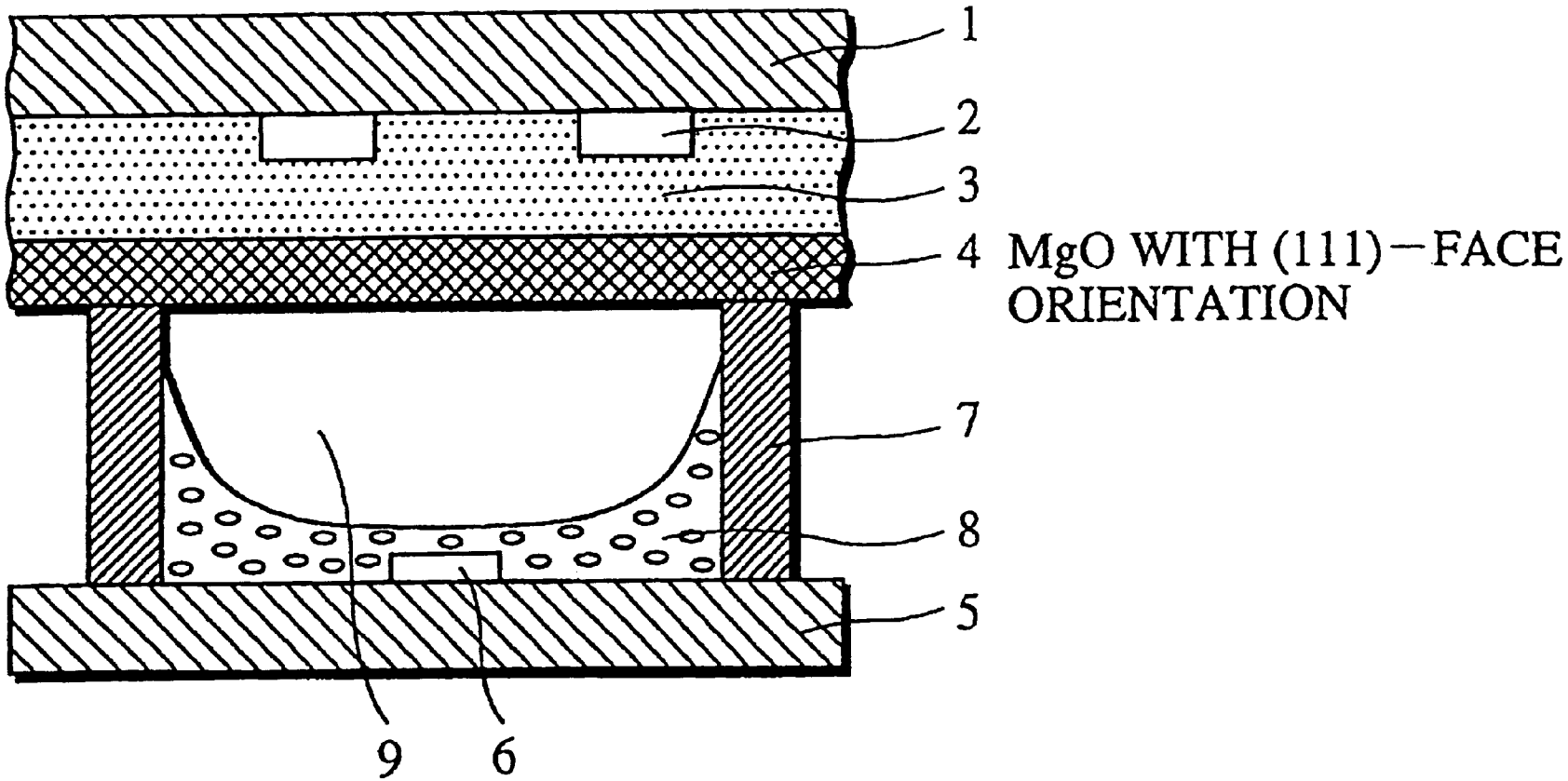
FIG. 1 is a sectional view of a conventional AC PDP.
Figure 2:
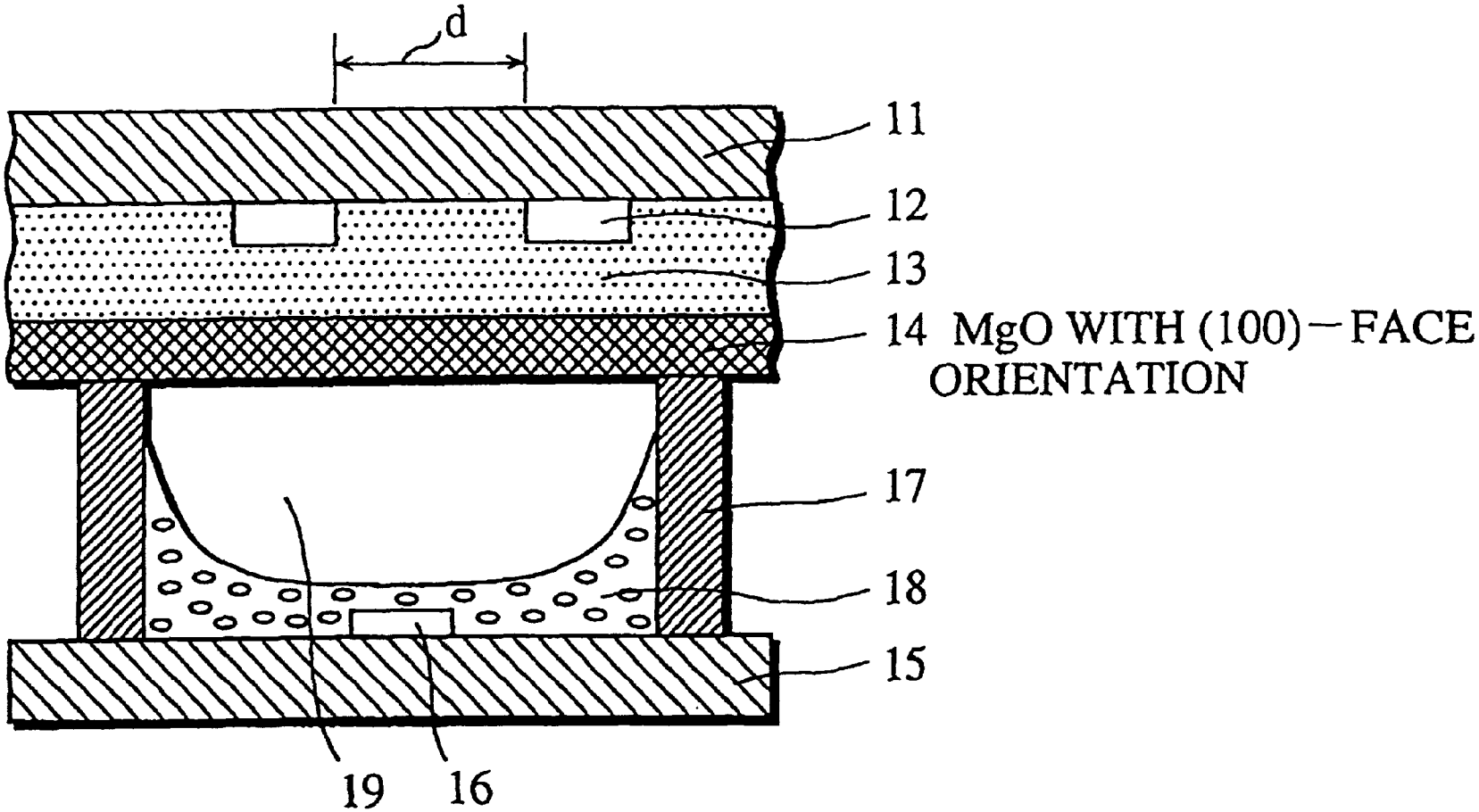
FIG. 2 is a sectional view of an AC PDP described in an embodiment of the present invention.

FIG. 2 is a sectional view of a discharge PDP of the present embodiment. Though FIG. 2 shows only one cell, a PDP includes a number of cells each of which emits red, green, or blue light.

The present PDP includes: a front panel which is made up of front glass substrate 11 with display electrodes 12 and dielectric glass layer 13 thereon; and a back panel which is made up of back glass substrate 15 with address electrode 16, partition walls 17, and fluorescent substance layer 18, the front panel and back panel being bonded together. Discharge space 19, which is sealed with the front panel and back panel, is charged with a discharge gas. The present PDP is made as follows.

Producing the Front Panel

The front panel is made by forming display electrodes 12 onto front glass substrate 11, covering it with dielectrics glass layer 13, then forming protecting layer 14 on the surface of dielectric glass layer 13.

In the present embodiment, discharge electrodes 12 are silver electrodes which are formed by transferring a paste for the silver electrodes onto front glass substrate 11 with screen printing then baking them. Dielectric glass layer 13, being lead glass, is composed of 75% by weight of lead oxide (PbO), 15% by weight of boron oxide ($B_2O_3$), and 10% by weight of silicon oxide ($SiO_2$). Dielectrics glass layer 13 is also formed with screen printing and baking.

Protecting layer 14 consists of an alkaline earth oxide with (100)-face orientation and is dense. The present embodiment uses a CVD method (thermal CVD method or plasma enhanced CVD method) to form such a dense protecting layer consisting of magnesium oxide with (100)-face orientation. The formation of the protecting layer with the CVD method will be described later.

Producing the Back Panel

The back panel is made by transferring the paste for the silver electrodes onto back glass substrate 15 by screen printing then baking back glass substrate 15 to form address electrodes 16 and by attaching partition walls 17 made of glass to back glass substrate 15 with a certain pitch. Fluorescent substance layer 18 is formed by inserting one of a red fluorescent substance, a green fluorescent substance, a blue fluorescent substance into each space surrounded by partition walls 17. Any fluorescent substance generally used for PDPs can be used for each color. The present embodiment uses the following fluorescent substances:

red fluorescent substance $(Y_xGd_{1-x})BO_3$: $Eu^{3+}$ green fluorescent substance $BaAl_{12}O_{19}$: Mn blue fluorescent substance $BaMgAl_{14}O_{23}$: $Eu^{2+}$ Producing a PDP by Bonding Panels A PDP is made by bonding the above front panel and back panel with sealing glass, at the same time excluding the air from discharge space 19 partitioned by partition walls 17 to high vacuum ($8\times10^{-7}$ Torr), then charging a discharge gas with a certain composition into discharge space 19 at a certain charging pressure.

In the present embodiment, cell pitch is under 0.2 mm and distance between electrodes "d" is under 0.1 mm, making the cell size of the PDP conform to 40-inch high-vision TVs.

The discharge gas is composed of He-Xe gas or Ne-Xe gas, both of which have been used conventionally. However, the amount of Xe is set to 10% by volume or more and the charging pressure to the range of 500 to 700 Torr.

Forming the Protecting Layer with the CVD Method

Figure 3:
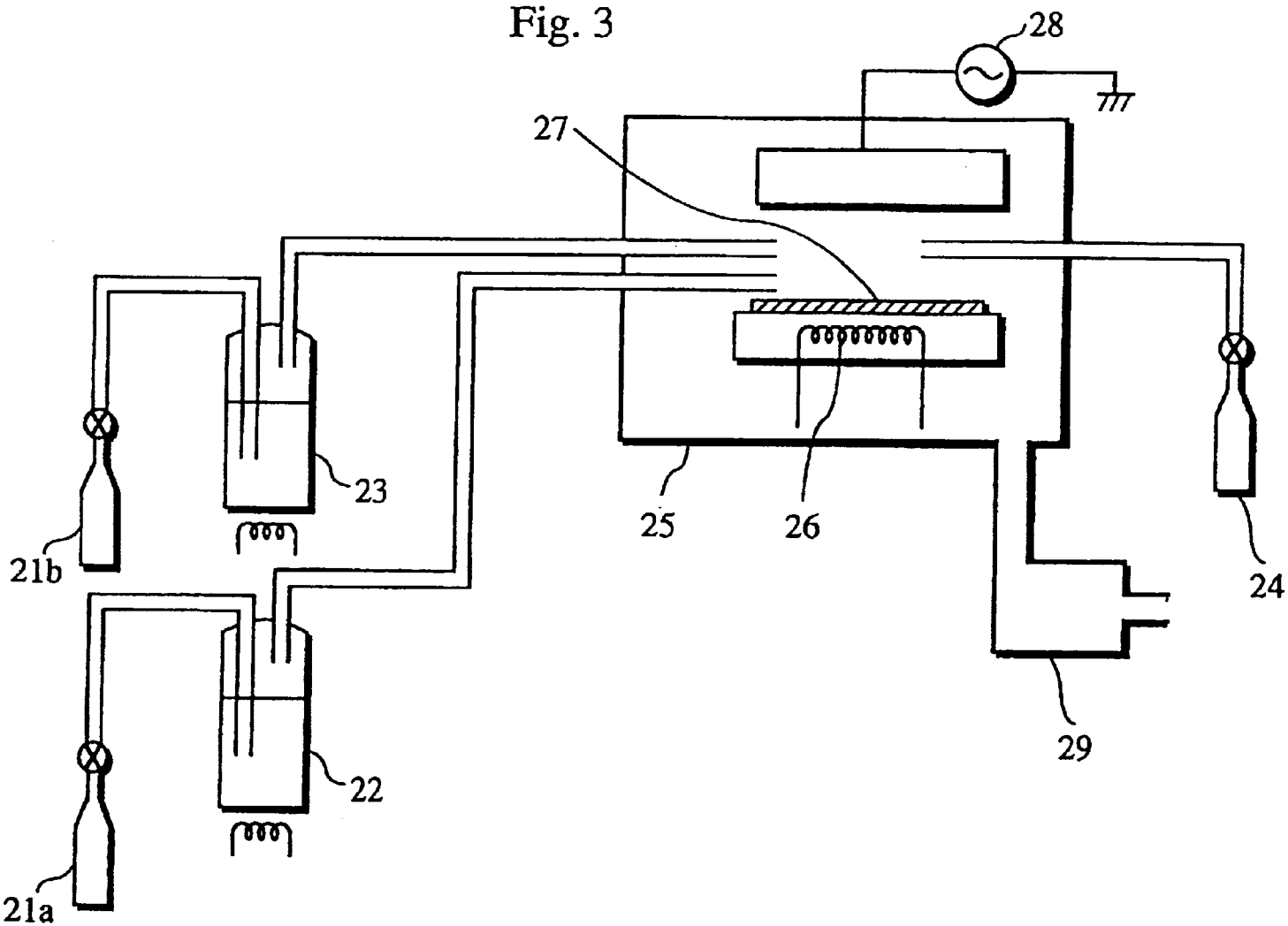
FIG. 3 shows a CVD apparatus used for forming protecting layer 14.

FIG. 3 shows a CVD apparatus used for forming protecting layer 14.

For the CVD apparatus, either of the thermal CVD method and plasma enhanced CVD method is applicable.

CVD apparatus 25 includes heater 26 for heating glass substrate 27 (equivalent to front glass substrate 11 with display electrodes 12 and dielectric glass layer 13 as shown in FIG. 2). The pressure inside CVD apparatus 25 can be reduced by venting apparatus 29. CVD apparatus 25 also includes high-frequency power 28 for generating plasma in CVD apparatus 25.

Ar-gas cylinders 21a and 21b supply argon (Ar) gas, which is used as a carrier, to CVD apparatus 25 respectively via bubblers 22 and 23.

Bubbler 22 stores a metal chelate of alkaline earth oxide used as the source and heats it. The metal chelate is transferred to CVD apparatus 25 when it is evaporated by the argon gas blown on it through Ar-gas cylinder 21a.

Bubbler 23 stores a cyclopentadienyl compound of alkaline earth oxide used as the source and heats it. The cyclopentadienyl compound is transferred to CVD apparatus 25 when it is evaporated by the argon gas blown on it through Ar-gas cylinder 21b.

Oxygen cylinder 24 supplies oxygen ($O_2$) used as a reaction gas to CVD apparatus 25.

(1) For thermal CVDs performed with the present CVD apparatus, glass substrate 27 is put on heating unit 26 with the dielectric glass layer on glass substrate 27 to be heated with a certain temperature (350 to 400° C. See Table 1 "HEATING TEMPERATURE FOR GLASS SUBSTRATE"). At the same time, the pressure in the reaction container is reduced by venting apparatus 29 (by about several tens Torr).

Bubbler 22 or 23 is used to heat the metal chelate or cyclopentadienyl compound of alkaline earth oxide used as the source to a certain temperature (See Table 1, "TEMPERATURE OF BUBBLER"). At the same time, Ar gas is sent to bubbler 22 or 23 through Ar-gas cylinder 21a or 21b and oxygen is sent through cylinder 24.

The metal chelate or cyclopentadienyl compound reacts with oxygen in CVD apparatus 25 to form a protecting layer consisting of an alkaline earth oxide on the surface of glass substrate 27.

(2) For plasma enhanced CVDs performed with the present CVD apparatus, the procedure is almost the same as that of the thermal CVD described above. However, glass substrate 27 is heated by heating unit 26 with temperature ranging from 250 to 300° C. (See Table 1, "HEATING TEMPERATURE FOR GLASS SUBSTRATE"). At the same time, the pressure in the reaction container is reduced to about 10 Torr by venting apparatus 29. Under the circumstances, a protecting layer consisting of an alkaline earth oxide is formed by driving high-frequency power 28 to apply high-frequency electric field of 13.56 MHz, generating plasma in CVD apparatus 25.

Conventionally, the thermal CVD method or plasma enhanced CVD method has not been used for forming a protecting layer. One of the reasons for not using these methods is that no appropriate source for these methods was found. The present inventors have made it possible to form a protecting layer with the thermal CVD method or plasma enhanced CVD method by using the sources described below.

The source (metal chelate or cyclopentadienyl compound) supplied through bubblers 22 and 23:

alkaline earth dipivaloylmethane compound $M(C_{11}H_{19}O_2)_2$, alkaline earth acetylacetone compound $M(C_5H_7O_2)_2$, alkaline earth trifluoroacetylacetone compound $M(C_5H_5F_3O_2)_2$, and alkaline earth cyclopentadiene compound $M(C_5H_5)_2$, where "M" represents an alkaline earth element.

In the present embodiment, the alkaline earth metal is magnesium. Therefore, the sources are as follows: magnesium dipivaloyl methane $Mg(C_{11}H_{19}O_2)_2$, magnesium acetylacetone $Mg(C_5H_7O_2)_2$, magnesium trifluoroacetylacetone $Mg(C_5H_5F_3O_2)_2$, and cyclopentadienyl magnesium $Mg(C_5H_5)_2$.

The protecting layer formed with the thermal CVD method or plasma enhanced CVD method allows the crystals of the alkaline earth oxides to grow slowly to form a dense protecting layer consisting of an alkaline earth oxide with (100)-face orientation.

Effects of Protecting Layer of Magnesium Oxide with (100)-Face Orientation

The conventional protecting layer of magnesium oxide formed by vacuum vapor deposition method (electron-beam evaporation method) has (111)-crystal-face orientation according to X-ray analysis (See No. 15 in Table 2 and Nos. 67 and 69 in Table 4). Compared to this, the protecting layer of a magnesium oxide with (100)-face orientation has the following characteristics and effects:

(1) the magnesium oxide with (100)-face orientation extends PDP life since it protects dielectrics glass layer due to its sputtering resistance owing to its density;

(2) the magnesium oxide with (100)-face orientation reduces driving voltage of PDP and improves panel brightness since it has a large emission coefficient (γ value) of secondary electron;

(3) The magnesium oxide with (111)-face orientation tends to react with the water content in the air to form hydroxides since it forms faces with the highest surface energy among a variety of faces with orientation (see Surface Techniques, Vol. 41, No. 4, 1990, page 50 and Japanese Laid-Open Patent Application No. 5-342991). Accordingly, magnesium oxide with (111)-face orientation has a problem that the formed hydroxides decompose during a discharge and reduce the amount of the emission of secondary electron. On the other hand, the protecting layer of a magnesium oxide with (100)-face orientation is to a large extent immune to this problem.

(4) The magnesium oxide with (111)-face orientation has a heat resistance of up to 350° C. On the other hand, since the protecting layer of a magnesium oxide with (100)-face orientation has a higher heat resistance, heat treatment is carried out at a temperature of about 450° C. when the front cover plate and the back plate are bonded.

(5) With the protecting layer of a magnesium oxide with (100)-face orientation, aging after bonding of panels is comparatively short.

These characteristics and effects are especially noticeable in the protecting layer of a magnesium oxide with (100)-face orientation formed with the thermal CVD method or plasma enhanced CVD method.

Relation between Xe Amount, Charging Pressure, and Brightness

The panel brightness improves by setting the amount of Xe in the discharge gas to 10% by volume or more and by setting the charging pressure for the discharge gas to the range of 500 to 760 Torr. The following are considered to be the reasons.

(1) Increase in the Amount of Ultraviolet Light

Setting the amount of Xe in the discharge gas to 10% by volume or more and setting the charging pressure for the discharge gas to the range of 500 to 760 Torr increase the amount of Xe in the discharge space, raising the amount of ultraviolet light emitted.

(2) Improvement in Conversion Efficiency of Fluorescent Substance with Shift of Ultraviolet Light to Longer Wavelength Conventionally, Xe emitted ultraviolet light mainly at 147 nm (resonance line of Xe molecule) since the amount of Xe in the discharge gas was set to 5% by volume or less and the charging pressure for the discharge gas to less than 500 Torr. However, by setting the amount of Xe in the discharge gas to 10% by volume or more and by setting the charging pressure for the discharge gas to the range of 500 to 760 Torr, ultraviolet light emission at 173 nm (molecular beam of Xe molecule), being a long wavelength, increases, improving the conversion efficiency of fluorescent substance (see a material published by Plasma Study Group in Electrical Engineers of Japan, May 9, 1995).

The above reason will be backed up by the following description.

Figure 4:
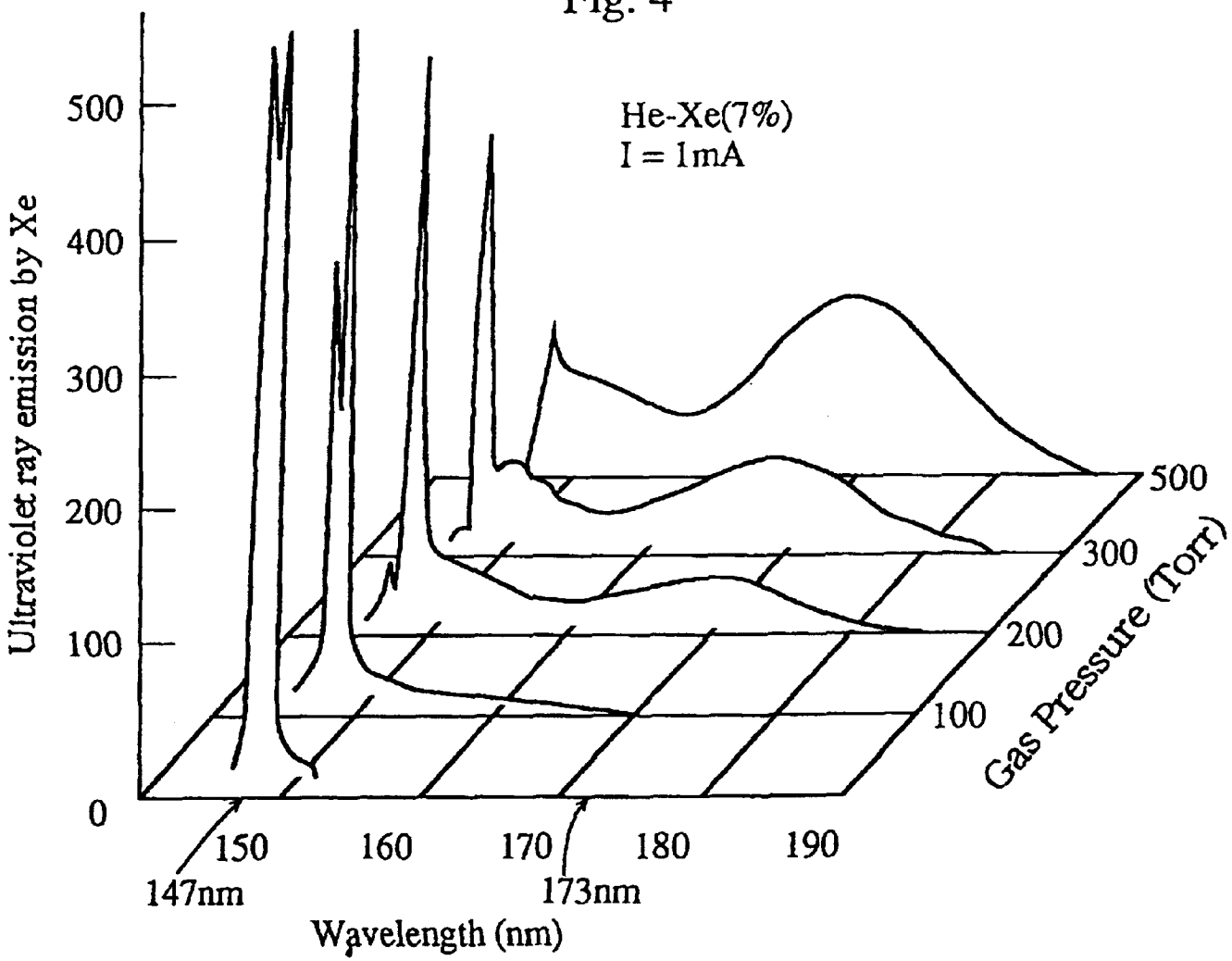
FIG. 4 is a graph showing the relation between the wavelength and amount of the ultraviolet light for each charging pressure, the ultraviolet light being emitted from Xe in He-Xe gas used as a discharge gas in a PDP.

FIG. 4 is a graph showing the change in relation between the wavelength and amount of the ultraviolet light for each charging pressure, the ultraviolet light being emitted from Xe in He-Xe gas used as a discharge gas in a PDP. This graph is introduced in O Plus E, No. 195, 1996, page 99.

It is apparent from FIG. 4 that if charging pressure is low, Xe emits ultraviolet light mainly at 147 nm (resonance line of Xe molecule) and that as the charging pressure increases, the ratio of ultraviolet light emission at 173 nm increases.

Figure 5A:
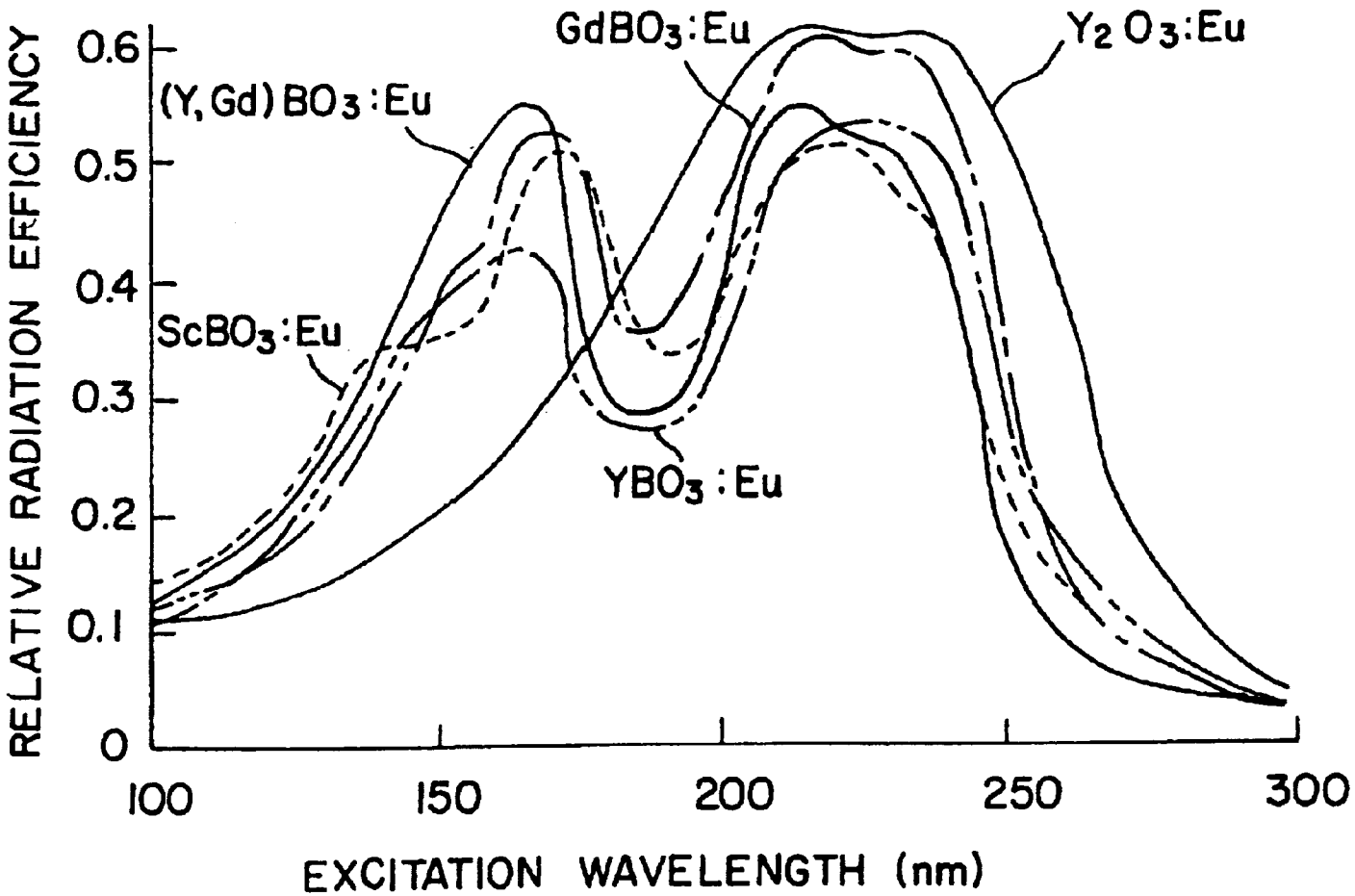
FIGS. 5(a)–(c) shows relation between excitation wavelength and relative radiation efficiency for each color of fluorescent substance.
Figure 5B:
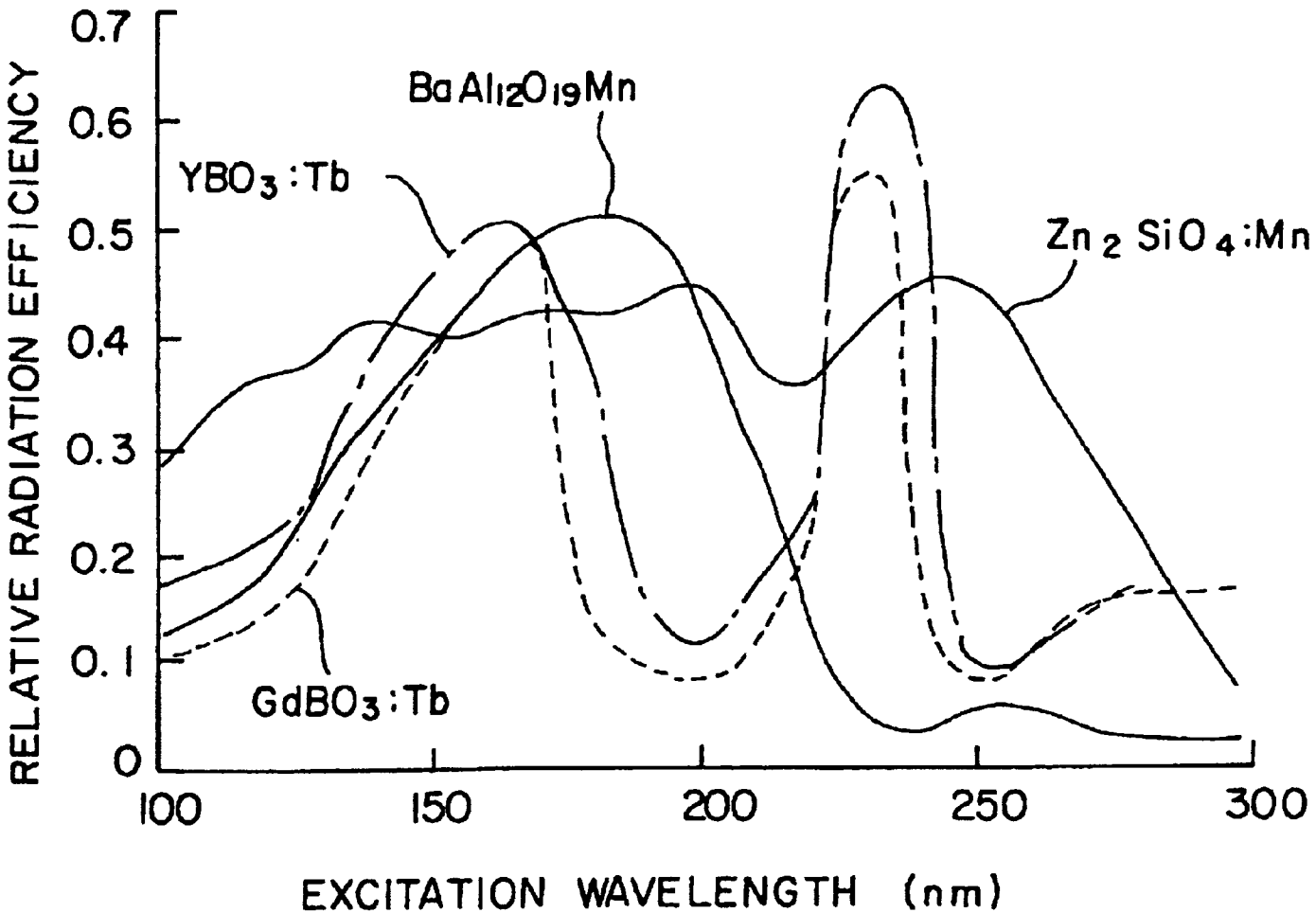
Figure 5C:
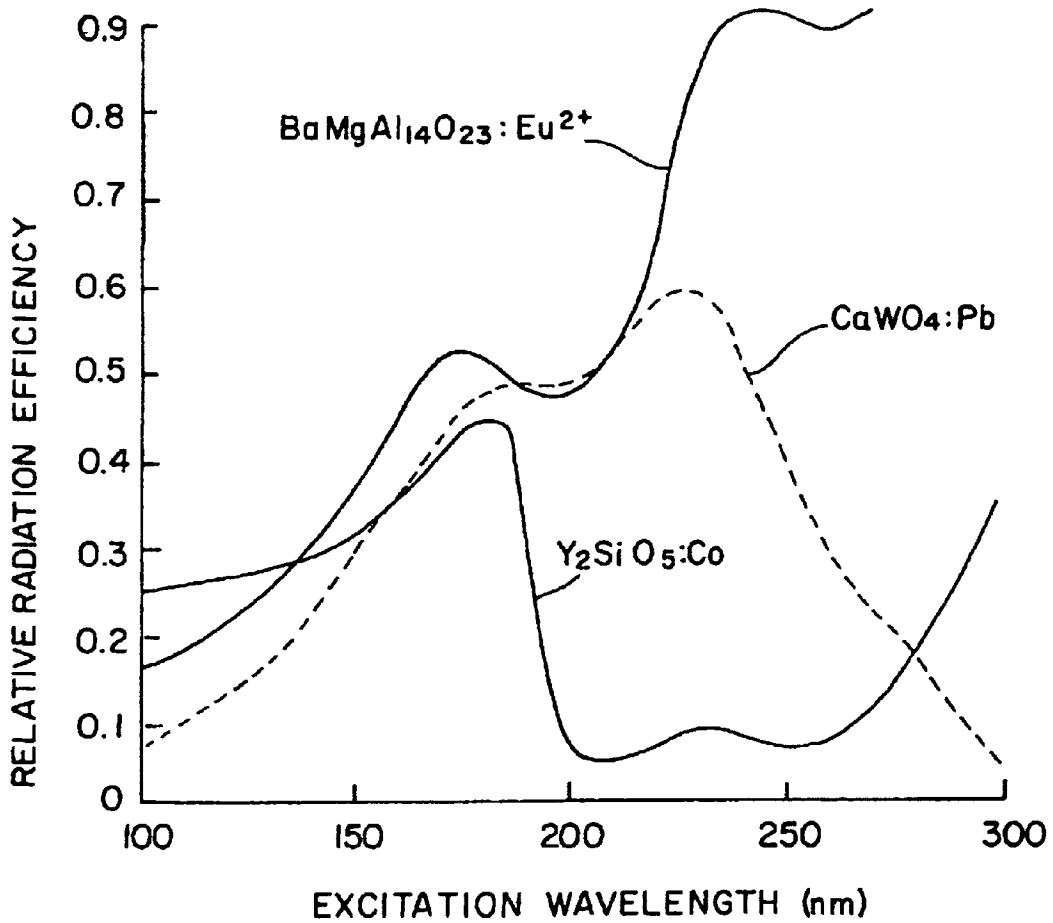

FIGS. 5(a)–(c) show relation between excitation wavelength and relative radiation efficiency for each color of fluorescent substance. This graph is included in O Plus E, No. 195, 1996, page 99. It is apparent from this drawing that the relative radiation efficiency is higher at 173 nm of wavelength than at 147 nm for every color of fluorescent substrate.

Relation between Discharge Gas Charging Pressure, Distance "d" between Discharge Electrodes, and Panel Driving Voltage.

The amount of Xe in the discharge gas and the charging pressure for the discharge gas are set to higher levels in the present embodiment. However, generally, this is considered to bring an inconvenience in that the PDP driving voltage increases since discharge start voltage "$V_f$" increases as the amount of Xe in the discharge gas or the charging pressure increases (see Japanese Laid-Open Patent Application No. 6-342631, column 2, pp 8–16 and 1996 Electrical Engineers of Japan National Conference Symposium, S3-1, Plasma Display Discharge, March, 1996).

However, such an inconvenience does not always occur. As is described below, the driving voltage may be low even if the charging pressure is set to a high level if distance "d" between discharge electrodes is set to a comparatively small value.

As described in Electronic Display Device, Ohm Corp., 1984, pp 113–114, the discharge start voltage $V_f$ may be represented as a function of P multiplied by d which is called the Paschen's Law.

Figure 6:
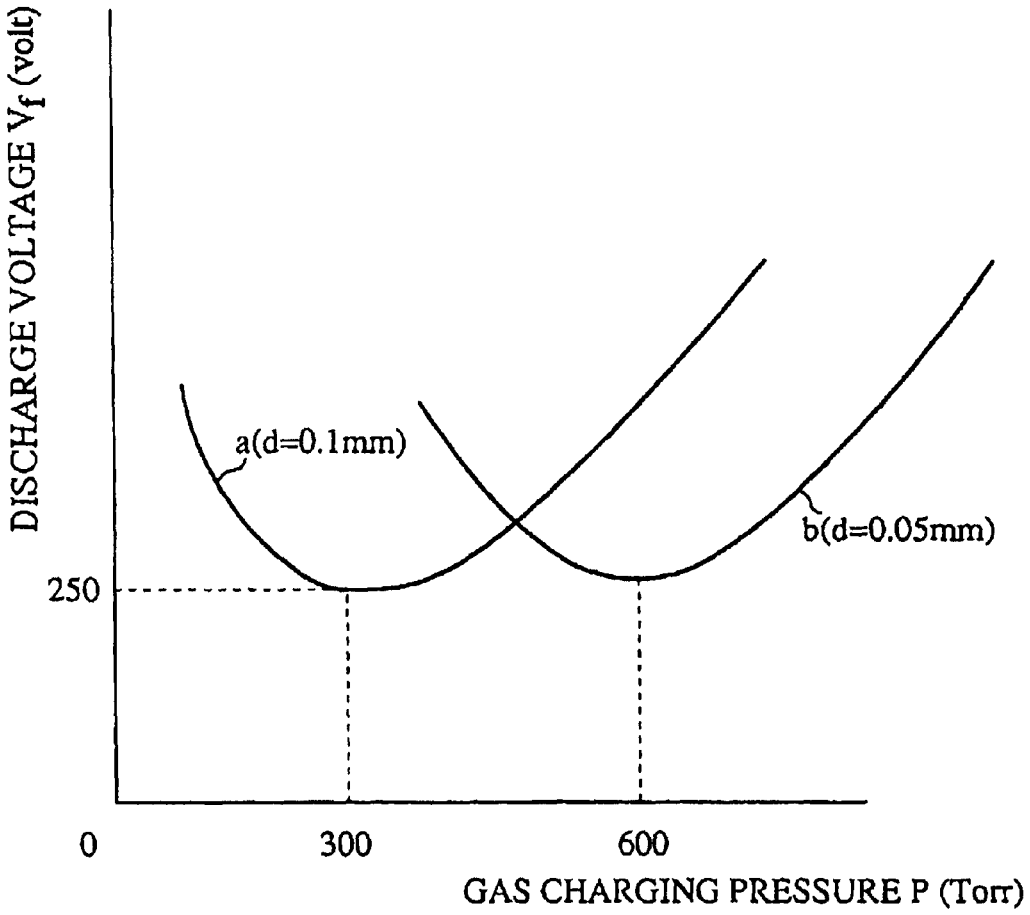
FIG. 6 is a graph showing relation between charging pressure P of the discharge gas and discharge start voltage Vf for two values of distance d, d being a distance between dielectric electrodes in a PDP.

FIG. 6 shows relation between charging pressure P of the discharge gas and discharge start voltage $V_f$ for two values of distance d: d=0.1 mm; and d=0.05 mm.

As shown in this graph, discharge start voltage $V_f$ corresponding to charging pressure P of the discharge gas is represented by a curve including a minimum.

Charging pressure P, being equal to the minimum, increases as d decreases. The curve of graph "a" (d=0.1 mm) passes through the minimum at 300 Torr, the curve of graph "b" (d=0.05 mm) at 600 Torr.

It is apparent from the above description that an appropriate value corresponding to distance d between discharge electrodes should be set as the charging pressure in order to keep PDP driving voltage low.

Also, it is possible to say that if distance d between discharge electrodes is set to 0.1 mm or less (desirably to about 0.05 mm), PDP driving voltage is kept low even if the charging pressure for the discharge gas is set to the range of 500 to 760 Torr.

As is apparent from the above description, the PDP of the present embodiment shows high panel brightness since the amount of Xe in the discharge gas is set to 10% by volume or more and the charging pressure for the discharge gas is set to the range of 500 to 760 Torr. Also, the driving voltage of the PDP of the present embodiment is kept low since distance d between discharge electrodes is set to 0.1 mm or less. Furthermore, the PDP of the present embodiment has a long life since it includes a protecting layer of a dense magnesium oxide with (100)-face orientation which shows good effects in protection.

EXAMPLES 1–9

Table 1 shows PDP Examples 1–9 which were made according to the present embodiment. The cell size of the PDP was set as follows: the height of partition walls 7 is 0.15 mm, the distance between partition walls 7 (cell pitch) 0.15 mm, and distance d between discharge electrodes 12 is 0.05 mm.

Dielectric glass layer 13, being lead glass, was formed by transferring a mixture of 75% by weight of lead oxide (PbO), 15% by weight of boron oxide ($B_2O_3$), 10% by weight of silicon oxide ($SiO_2$), and organic binder (made by dissolving 10% ethyl cellulose in α-terpineol) onto front glass substrate 11 with display electrodes 12 by screen printing and baking them for 10 minutes at 520° C. The thickness of dielectric glass layer 13 was set to 20 μm.

The ratio of He to Xe in the discharge gas and the charging pressure were set as shown in Table 1 except that the ratio of He in the discharge gas was set to less than 10% by volume for Examples 7 and 9 and that the charging pressure for the discharge gas was set to less than 500 Torr for Examples 7 and 8.

Regarding to the method of forming the protecting layer, the thermal CVD method was applied to Examples 1, 3, 5, and 7–9, and the plasma enhanced CVD method to Examples 2, 4, and 6. Also, magnesium dipivaloyl methane $Mg(C_{11}H_{19}O_2)_2$ was used as the source for Examples 1, 2, 7, 8, and 9, magnesium acetylacetone $Mg(C_5H_7O_2)_2$ for Examples 3 and 4, and cyclopentadienyl magnesium $Mg(C_5H_5)_2$ for Examples 5 and 6.

The temperature of bubblers 22 and 23 and the heating temperature of glass substrate 27 were set as shown in Table 1.

For the thermal CVD method, Ar gas was provided for one minute with the flow rate of 1l/min., oxygen for one minute with the flow rate of 2l/min. Also, the layer forming speed was adjusted to 1.0 μm/min., bringing the thickness of magnesium oxide protecting layer to 1.0 μm.

For the plasma enhanced CVD method, Ar gas was provided for one minute with the flow rate of 1l/min., oxygen for one minute with the flow rate of 2l/min. High-frequency wave was applied for one minute with 300W. Also, the layer forming speed was adjusted to 0.9 μm/min., bringing the thickness of magnesium oxide protecting layer to 0.9 μm.

With the X-ray analysis of the protecting layers of Examples 1–9, which had been formed as described above, it was confirmed for each Example that the crystals of magnesium oxides have (100)-face orientation.

Embodiment 2

The overall structure and production method of the PDP of the present embodiment is the same as that of Embodiment 1 except that a dense protecting layer consisting of magnesium oxide with (100)-face orientation is formed with a printing method shown below.

Forming of Protecting Layer with Printing Method

A dense protecting layer consisting of magnesium oxide with (100)-face orientation is formed by transferring magnesium salt paste with a plate-shaped crystal structure onto the dielectric glass layer and baking it.

The magnesium salts with a plate-shaped crystal structure for use are magnesium carbonate ($MgCO_3$), magnesium hydroxide ($Mg(OH)_2$), magnesium oxalate ($MgC_2O_4$), etc. The production methods of these magnesium salts are described below in Examples 10–14.

The dense protecting layer consisting of magnesium oxide with (100)-face orientation formed by the printing method has the same effects as that formed with the method shown in Embodiment 1.

EXAMPLES 10–15

Table 2 shows PDP Examples 10–15 whose cell size and distance d between discharge electrodes 12 were set in the same way as PDP Examples 1–9.

Examples 10–14 were made according to the present embodiment. Example 15 includes a protecting layer formed by a conventional vacuum vapor deposition method.

The magnesium oxalate ($MgC_2O_4$) with a plate-shaped crystal structure used for Example 10 was produbed by dissolving ammonium oxalate ($NH_4HC_2O_4$) in magnesium chloride ($MgCl_2$) aqueous solution to make a magnesium oxalate aqueous solution then heating it at 150° C.

The magnesium carbonate with a plate-shaped crystal structure used for Example 11 was produced by dissolving ammonium carbonate ($(NH_4)_2CO_3$) in magnesium chloride ($MgCl_2$) aqueous solution to make magnesium carbonate ($MgCO_3$), then heating it in carbonic acid gas to 900° C.

The magnesium hydroxide with a plate-shaped crystal structure used for Examples 12–14 was produced by dissolving sodium hydroxide (NaOH) in a magnesium chloride ($MgCl_2$) aqueous solution to make magnesium hydroxide ($Mg(OH)_2$), then pressurizing and heating it in sodium hydroxide at 5 atmosphere pressures and 900° C.

Each of the magnesium salts with a plate-shaped crystal structure made as described above was mixed with an organic binder (made by dissolving 10% ethyl cellulose in 90% by weight of terpineol) by using a three-roller mill to establish a paste, then the paste was transferred onto the dielectrics glass layer by screen printing with a thickness of 3.5 μm.

After baking each of these for 20 minutes at 500° C., a protecting layer consisting of magnesium oxide with a thickness of about 1.7 μm was formed.

With the X-ray analysis of the protecting layers of Examples 10–14, which had been formed as described above, it was confirmed for each Example that the crystals of magnesium oxides had (100)-face orientation.

For Example 15, a protecting layer was formed by the vacuum vapor deposition method, that is, by heating magnesium oxide with electron beam. With the X-ray analysis of the protecting layer, it was confirmed that the crystals of magnesium oxides had (111)-face orientation.

Embodiment 3

The overall structure and production method of the PDP of the present embodiment is the same as that of Embodiment 1 except that a gas including Ar or Kr, namely Ar-Xe, Kr-Xe, Ar-Ne-Xe, Ar-He-Xe, Kr-Ne-Xe, or Kr-He-Xe gas is used as the discharge gas.

By mixing Ar or Kr with the discharge gas, the panel brightness is further improved. The reason is considered that the ratio of ultraviolet light emission at 173 nm increases further.

Here, it is desirable that the amount of Xe is set to the range from 10 to 70% by volume since the driving voltage tends to rise if the amount exceeds 70% by volume.

Also, for three-element discharge gases such as Ar-Ne-Xe, Ar-He-Xe, Kr-Ne-Xe, and Kr-He-Xe gases, it is desirable that the amount of Kr, Ar, He, or Ne should be in the range of 10 to 50% by volume.

In the present embodiment, in forming a protecting layer, a method for evaporating a magnesium oxide with (110)-face orientation onto the dielectrics glass layer with irradiation of ion or electron beam is used as well as the thermal CVD or plasma enhanced CVD method for forming magnesium oxide with (100)-face orientation as described in Embodiment 1. The method is described below.

Figure 7:
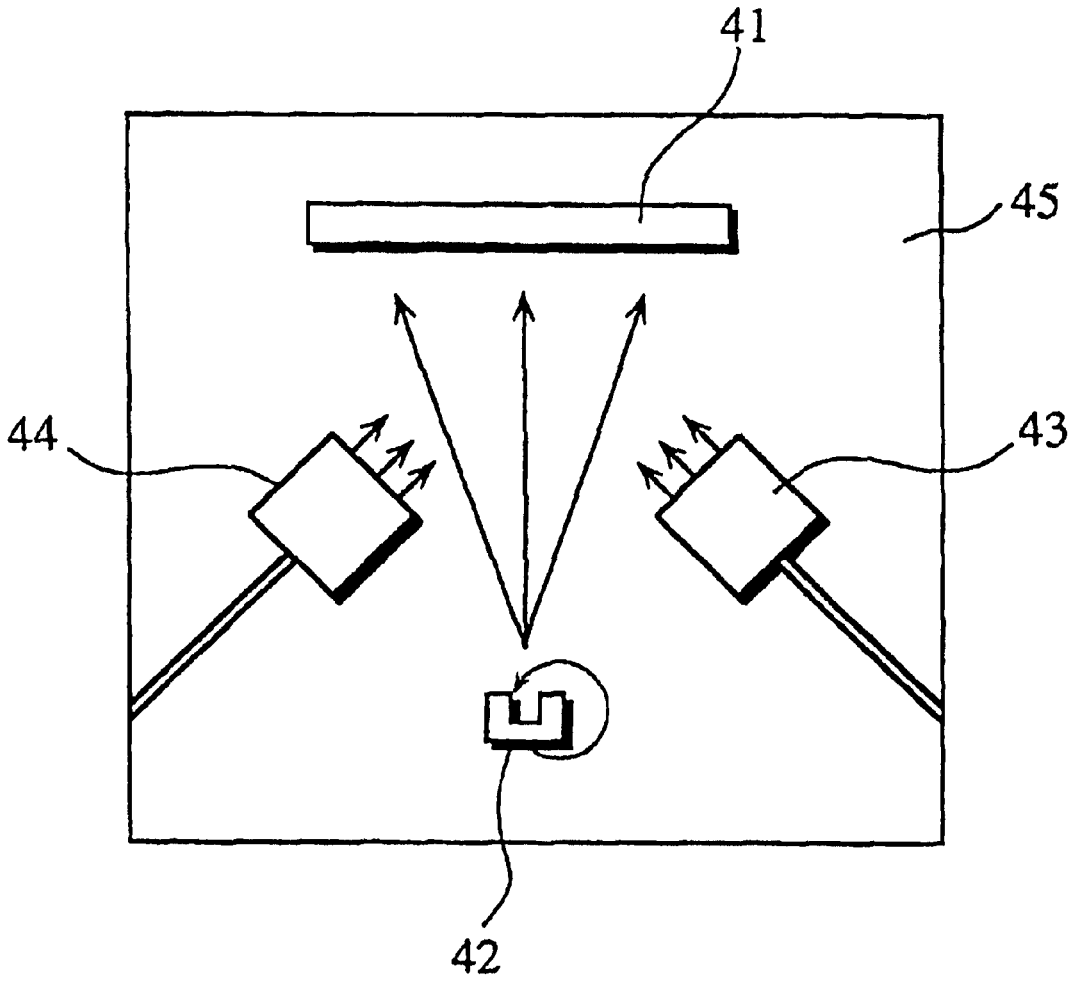
FIG. 7 shows an ion/electron beam irradiating apparatus which is used for forming a protecting layer in the PDP of Embodiment 3.

Method for Evaporating Alkaline Earth Oxide onto Dielectrics Glass Layer by Use of Ion or Electron Beam Irradiation to Form Protecting Layer FIG. 7 shows an ion/electron beam irradiating apparatus which is used for forming a protecting layer in the PDP of the present embodiment.

The ion/electron beam irradiating apparatus includes vacuum chamber 45 to which glass substrate 41 with a dielectrics glass layer is attached. Vacuum chamber 45 also includes electron gun 42 for evaporating an alkaline earth oxide (in the present embodiment, magnesium oxide).

Ion gun 43 irradiates ion beam to vapor of the alkaline earth oxide which has been evaporated by electron gun 42. Electron gun 44 irradiates electron beam to vapor of the alkaline earth oxide evaporated by electron gun 42.

The following description shows how to evaporate the alkaline earth oxide onto the dielectric glass layer by irradiating ion or electron beam to vapor using the ion/electron beam irradiating apparatus of the present invention.

First, glass substrate 41 with a dielectric glass layer is set in chamber 45 then crystals of an alkaline earth oxide are put in electron gun 42.

Secondly, chamber 45 is evacuated then substrate 41 is heated (150° C.). Electron gun 42 is used to evaporate the alkaline earth oxide. At the same time, ion gun 43 or electron gun 44 is used to irradiate argon ion or electron beam towards substrate 41. It forms a protecting layer of an alkaline earth oxide.

The crystals of the alkaline earth oxide grow slowly and a dense protecting layer consisting of an alkaline earth oxide with (110)-face orientation is formed when, as is described above, the alkaline earth oxide is evaporated onto the dielectrics glass layer by irradiation of the ion or electron beam. The formed protecting layer shows almost the same effects as the dense protecting layer of an alkaline earth oxide with (100)-face orientation formed in Embodiment 1.

EXAMPLES 16–34

Table 3 shows PDP Examples 16–34 which were made according to the present embodiment. Refer to "DISCHARGE GAS TYPE AND RATIO" column in the table for the discharge gas compositions, and "GAS CHARGING PRESSURE" column for charging pressures.

The protecting layer of Examples 16 and 27 were formed as described in Embodiment 1 using magnesium dipivaloyl methane $Mg(C_{11}H_{19}O_2)_2$ as the source with the thermal CVD method, and Examples 17, 23, 24, 28, 32, and 33 with the plasma enhanced CVD method.

For Examples 18, 21, 22, 25, 26, and 34, ion beam (current of 10 mA) was irradiated, and for Examples 19, 20, 30, and 31, electron beam (10 mA), to evaporate a magnesium oxide onto the dielectric glass layer to form a protecting layer with a layer thickness of 5000A.

With the X-ray analysis of the protecting layers which had been formed by evaporating magnesium oxides onto the dielectrics glass layer with irradiation of ion or electron beam, it was confirmed that the crystals of the magnesium oxides had (110)-face orientation.

Embodiment 4

The overall structure and production method of the PDP of the present embodiment is the same as that of Embodiment 1 except that the cell pitch is set to a larger value and the amount of Xe in a He-Xe gas used as the discharge gas is set to less than 10% by volume. Note that the distance between electrodes "d" is set to an equal or larger value.

In the present embodiment, alkaline earth oxides with (100)-face orientation other than magnesium oxide (MgO) are formed as the protecting layers, such as beryllium oxide (BeO), calcium oxide (CaO), strontium oxide (SrO), and barium oxide (BaO).

These protecting layers are formed by using appropriate sources for respective alkaline earths with the thermal or plasma enhanced CVD method described in Embodiment 1.

The discharge electrodes formed on the front glass substrate includes a tin oxide-antimony oxide or an indium oxide-tin oxide.

The protecting layer of beryllium oxide, calcium oxide, strontium oxide, or barium oxide with (100)-face orientation has almost the same effects as the magnesium oxide with (100)-face orientation formed in Embodiment 1.

EXAMPLES 35–66

Table 4 shows PDP Examples 35–66 which were made according to the present embodiment. The height of the partition walls was set to 0.2 mm, the distance between partition walls (cell pitch) 0.3 mm, and distance d between discharge electrodes 0.05 mm. The discharge gas was a He-Xe mixture gas including 5% by volume of Xe, and the charging pressure was set to 500 Torr.

The discharge electrodes, which were made with sputtering and photo-lithography methods, consist of indium oxide ($In_2O_3$) including 10% by weight of tin oxide ($SnO_2$).

The protecting layers were made with the thermal or plasma enhanced CVD method from metal chelate or cyclopentadienyl compounds of the alkaline earth oxides shown in Table 4 "CVD SOURCE" column. The formed layers were of magnesium oxide, beryllium oxide, calcium oxide, strontium oxide, or barium oxide as shown in "ALKALINE EARTH OXIDE" column.

With the X-ray analysis of the protecting layers, it was confirmed that each Example had (100)-face orientation.

Reference

Examples 67–69 shown in Table 4 were made in the same way as Examples 35–66. However, the protecting layers of Examples 67–69 were formed with different methods: for Example 67, the vacuum vapor deposition method for evaporating magnesium oxide onto the dielectric glass layer by heating magnesium oxide with an electron beam was used; for Example 68, the sputtering was performed on magnesium oxide as the target; and for Example 69, the screen printing was done with magnesium oxide paste.

With the X-ray analysis of the protecting layers, it was confirmed that the magnesium oxide protecting layers of Examples 67 and 69 had (111)-face orientation. It was also confirmed that magnesium oxide protecting layer of Examples 68 had (100)-face orientation. However, the protecting layer of Example 68 is not considered as dense since it was formed with the sputtering.

Experiment 1

Measuring Ultraviolet Light Wavelength and Panel Brightness (Initial Value)

Experiment Method

For Examples 1–15, the ultraviolet light wavelength and panel brightness (initial value) were measured when they were operated on 150V of discharge maintenance voltage and 30 KHz of frequency.

Results and Analysis

As shown in Tables 1–3, resonance lines of Xe with a wavelength of 147 nm were mainly observed from examples 7–9, showing low panel brightness (around 200 cd/m$^2$), while molecular beams of Xe with a wavelength of 173 nm were mainly observed from examples 1–6 and 10–34, showing high panel brightness (around 400 cd/m$^2$ or more). Of these, Examples 16–34 showed the highest panel brightness (around. 500 cd/m$^2$ or more).

It is apparent from the above results that the panel brightness is improved by setting the amount of Xe in the discharge gas to 10% by volume or more, charging pressure to 500 Torr or more and that the panel brightness is further improved by mixing Kr or Ar with the discharge gas.

The panel brightness of example 15 is slightly lower than those of Examples 1–6 and 10–14. The reason is considered to be that the protecting layer of Example 15 consisting of magnesium oxide with (111)-face orientation emits less secondary electrons than that with (100)-face orientation.

Experiment 2

Measuring Change Rates of Panel Brightness and Discharge Maintenance Voltage Experiment Method For Examples 1–15 and 35–69, the change rates (change rates from respective initial values after 7,000 hours of operation) of panel brightness and discharge maintenance voltage were measured after they were operated for 7,000 hours on 150V of discharge maintenance voltage and 30 kHz of frequency.

For Examples 16–34, the change rates of panel brightness and discharge maintenance voltage were measured after they were operated for 5,000 hours on 170V of discharge maintenance voltage and 30 kHz of frequency.

Results and Analysis

As shown in Tables 1 and 2, the panel brightness change rates of examples 1–6 and 10–14 are smaller than those of examples 7–9. Also, as shown in Table 3, the change rates of panel brightness and discharge maintenance voltage of examples 16–34 were small as a whole.

It is apparent from the above results that the panel brightness change rate reduces by setting the amount of Xe in discharge gas to 10% by volume or more, charging pressure to 500 Torr or more.

The change rates of panel brightness and discharge maintenance voltage of examples 1–14 are smaller than those of Example 15. The reason is considered that the protecting layer of magnesium oxide with (111)-face orientation has higher sputtering resistance and higher efficiency in protecting dielectrics glass layer than that with (100)-face orientation.

As shown in Table 4, the change rates of panel brightness and discharge maintenance voltage of examples 35–66 are little, and those of examples 67–69 great.

The above results show that generally the protecting layer of alkaline earth oxide with (100)-face or (110)-face orientation formed with the thermal CVD method, plasma enhanced CVD method, or vapor deposition method with ion or electron beam irradiation has higher sputtering resistance and higher efficiency in protecting dielectrics glass layer than that with (111)-face orientation. Note that the results of example 67 show that the protecting layer consisting of alkaline earth oxide with (100)-face orientation formed with the sputtering method has high change rates of panel brightness and discharge maintenance voltage and low efficiency in protecting dielectrics glass layer.

The reason for the above results is considered that for the alkaline earth oxide of the protecting layer which has been formed by the thermal CVD, plasma enhanced CVD, or a method of evaporating the oxide onto a layer by irradiating ion or electron beam, the crystals grow slowly to form a dense protecting layer with (100)-face or (110)-face orientation; for the protecting layer formed by the sputtering method, the crystals do not grow slowly and the protecting layer does not become dense though it has (100)-face orientation.

Others

The values in Tables 1–4 in "BUBBLER TEMPERATURE," "HEATING TEMPERATURE FOR GLASS SUBSTRATE,," "PANEL BAKING TEMPERATURE," "PRINTED LAYER THICKNESS," "Ar GAS FLOW RATE," and "$O_2$ GAS FLOW RATE" were considered to be optimum for the respective alkaline earth sources.

The results of the change rates of panel brightness and dielectric maintenance voltage shown in Table 4 were obtained from PDPs with 5% by volume of Xe in discharge gas. However, the same results may be obtained from those with 10% by volume or more of Xe.

In the above Embodiments, the back panel of the PDPs includes back glass substrate 15 with which partition walls 17 are bonded. However, the present invention is not limited to such construction and may be applied to general AC PDPs such as those having partition walls attached to the front panel.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

TABLE 1

| EXAMPLE No. | PROTECTING LAYER FORMING METHOD | CVD SOURCE | BUBBLER TEMPERATURE (° C.) | HEATING TEMPERATURE FOR GLASS SUBSTRATE (° C.) | X-RAY ANALYSIS RESULT | DISCHARGE GAS TYPE AND RATIO (%) |
|---|---|---|---|---|---|---|
| 1 | THERMAL CVD | $Mg(C_{11}H_{19}O_2)_2$ | 125 | 350 | (100)-FACE ORIENTATION | He(90)-Xe(10) |
| 2 | PLASMA ENHANCED CVD | $Mg(C_{11}H_{19}O_2)_2$ | 125 | 250 | (100)-FACE ORIENTATION | He(80)-Xe(20) |
| 3 | THERMAL CVD | $Mg(C_5H_7O)_2$ | 185 | 400 | (100)-FACE ORIENTATION | He(50)-Xe(50) |
| 4 | PLASMA ENHANCED CVD | " | " | 300 | (100)-FACE ORIENTATION | He(10)-Xe(90) |
| 5 | THERMAL CVD | $Mg(C_5H_5)_2$ | 80 | 350 | (100)-FACE ORIENTATION | He(1)-Xe(99) |
| 6 | PLASMA CVD | " | 80 | 250 | (100)-FACE ORIENTATION | He(30)-Xe(70) |
| 7 | THERMAL CVD | $Mg(C_{11}H_{19}O_2)_2$ | 125 | 350 | (100)-FACE ORIENTATION | He(98)-Xe(2) |
| 8 | THERMAL CVD | " | " | " | (100)-FACE ORIENTATION | He(80)-Xe(20) |
| 9 | THERMAL CVD | " | " | " | (100)-FACE ORIENTATION | He(90)-Xe(5) |

| | | GAS | ULTRA | PANEL | CHARACTERISTICS CHANGE RATE AFTER 7000 H, 150 V, 30 KHz | |
|---|---|---|---|---|---|---|
| | EXAMPLE No. | CHARGING PRESSURE (Torr) | VIOLET RAY WAVELENGTH | BRIGHTNESS (INITIAL VALUE) (cd/m$^2$) | PANEL BRIGHTNESS (%) | DISCHARGE MAINTENANCE VOLTAGE(%) |
| | 1 | 500 | 173 nm BY MOLECULAR BEAM | 430 | −8.4 | 2.4 |

TABLE 1-continued

| | | | | | |
|---|---|---|---|---|---|
| 2 | 600 | 173 nm BY MOLECULAR BEAM | 450 | −7.8 | 2.2 |
| 3 | 650 | 173 nm BY MOLECULAR BEAM | 460 | −7.5 | 2.3 |
| 4 | 700 | 173 nm BY MOLECULAR BEAM | 440 | −7.0 | 2.4 |
| 5 | 650 | 173 nm BY MOLECULAR BEAM | 430 | −7.2 | 2.3 |
| 6 | 760 | 173 nm BY MOLECULAR BEAM | 435 | −7.5 | 2.5 |
| 7 | 300 | 147 nm BY RESONANCE LINE | 205 | −9.4 | 2.5 |
| 8 | 450 | 147 nm BY RESONANCE LINE | 210 | −9.5 | 2.8 |
| 9 | 550 | 147 nm BY RESONANCE LINE | 205 | −9.8 | 2.9 |

TABLE 2

| EXAMPLE No. | SOURCE OF PLATE-SHAPED MgO | GAINED PLATE-SHAPED MAGNESIUM SALT | PRINTED LAYER THICKNESS (μm) | PANEL BAKING TEMPERATURE (° C.) | X-RAY ANALYSIS RESULT | DISCHARGE GAS TYPE AND RATIO (%) |
|---|---|---|---|---|---|---|
| 10 | MgCl2,NH4HC2O4 | MgC2O4 | 3.5 | 500 | (100)-FACE ORIENTATION | Ne(50)-Xe(50) |
| 11 | MgCl2,(NH4)2CO3 | MgCO3 | " | " | (100)-FACE ORIENTATION | Ne(30)-Xe(70) |
| 12 | MgCl2,NaOH | Mg(OH)2 | " | " | (100)-FACE ORIENTATION | Ne(60)-Xe(40) |
| 13 | " | " | " | " | (100)-FACE ORIENTATION | Ne(1)-Xe(99) |
| 14 | " | " | " | " | (100)-FACE ORIENTATION | Ne(90)-Xe(10) |
| 15 | VACUUM VAPOR DEPOSITION ON MgO WITH ELECTRON BEAM | | | | (111)-FACE ORIENTATION | Ne(50)-Xe(50) |

| EXAMPLE No. | GAS CHARGING PRESSURE (Torr) | ULTRA VIOLET RAY WAVELENGTH | PANEL BRIGHTNESS (INITIAL VALUE) (cd/m$^2$) | CHARACTERISTICS CHANGE RATE AFTER PANEL BRIGHTNESS (%) | CHARACTERISTICS CHANGE RATE AFTER DISCHARGE MAINTENANCE VOLTAGE(%) |
|---|---|---|---|---|---|
| 10 | 650 | 173 nm BY MOLECULAR BEAM | 410 | −5.8 | 2.2 |
| 11 | 700 | 173 nm BY MOLECULAR BEAM | 425 | −6.5 | 2.8 |
| 12 | 550 | 173 nm BY MOLECULAR BEAM | 430 | −7.2 | 2.6 |
| 13 | 600 | 173 nm BY MOLECULAR BEAM | 415 | −7.5 | 2.8 |
| 14 | 760 | 173 nm BY MOLECULAR BEAM | 408 | −7.2 | 2.9 |
| 15 | 650 | 173 nm BY MOLECULAR BEAM | 380 | −15.8 | 3.2 |

TABLE 3

| EXAMPLE No. | PROTECTING LAYER FORMING METHOD | CVD SOURCE | BUBBLER TEMPERATURE (° C.) | HEATING TEMPERATURE FOR GLASS SUBSTRATE (° C.) | X-RAY ANALYSIS RESULT | DISCHARGE GAS TYPE AND RATIO (%) |
|---|---|---|---|---|---|---|
| 16 | THERMAL CVD | $Mg(C_{11}H_{19}O_2)_2$ | 125 | 350 | (100)-FACE ORIENTATION | Ar(90)-Xe(10) |
| 17 | PLASMA ENHANCED CVD | $Mg(C_{11}H_{19}O_2)_2$ | 125 | 250 | (100)-FACE ORIENTATION | Ar(50)-Xe(50) |
| 18 | VAPOR DEPOSITION OF MgO BY IRRADIATING ION BEAM | | | 150 | (110)-FACE ORIENTATION | Ar(30)-Xe(70) |
| 19 | VAPOR DEPOSITION OF MgO BY IRRADIATING ELECTRON BEAM | | | " | (110)-FACE ORIENTATION | " |
| 20 | VAPOR DEPOSITION OF MgO BY IRRADIATING ELECTRON BEAM | | | " | (110)-FACE ORIENTATION | Kr(90)-Xe(10) |
| 21 | VAPOR DEPOSITION OF MgO BY IRRADIATING ION BEAM | | | " | (110)-FACE ORIENTATION | Kr(50)-Xe(50) |
| 22 | VAPOR DEPOSITION OF MgO BY IRRADIATING ION BEAM | | | " | (110)-FACE ORIENTATION | Kr(30)-Xe(70) |
| 23 | PLASMA ENHANCED CVD | $Mg(C_{11}H_{19}O_2)_2$ | 125 | 250 | (100)-FACE ORIENTATION | Xe(10)-Ar(40)-Ne(50) |
| 24 | PLASMA ENHANCED CVD | " | " | " | (100)-FACE ORIENTATION | Xe(40)-Ar(50)-Ne(10) |
| 25 | VAPOR DEPOSITION OF MgO BY IRRADIATING ION BEAM | | | 150 | (110)-FACE ORIENTATION | Xe(70)-Ar(10)-Ne(20) |
| 26 | VAPOR DEPOSITION OF MgO BY IRRADIATING ION BEAM | | | " | (110)-FACE | Xe(10)-Ar(40)-Ne(50) |
| 27 | THERMAL CVD | $Mg(C_{11}H_{19}O_2)_2$ | 125 | 350 | (100)-FACE ORIENTATION | Xe(40)-Ar(50)-Ne(10) |
| 28 | PLASMA ENHANCED CVD | " | " | 250 | (100)-FACE ORIENTATION | Xe(70)-Ar(10)-Ne(20) |
| 29 | PLASMA ENHANCED CVD | " | " | " | (100)-FACE ORIENTATION | Xe(10)-Ar(40)-Ne(50) |
| 30 | VAPOR DEPOSITION OF MgO BY IRRADIATING ELECTRON BEAM | | | 150 | (110)-FACE ORIENTATION | Xe(40)-Ar(50)-Ne(10) |
| 31 | VAPOR DEPOSITION OF MgO BY IRRADIATING ELECTRON BEAM | | | " | (110)-FACE ORIENTATION | Xe(70)-Ar(10)-Ne(20) |
| 32 | PLASMA ENHANCED CVD | $Mg(C_{11}H_{19}O_2)_2$ | 125 | 250 | (100)-FACE ORIENTATION | Xe(10)-Ar(40)-Ne(50) |
| 33 | PLASMA ENHANCED CVD | $Mg(C_{11}H_{19}O_2)_2$ | " | " | (100)-FACE ORIENTATION | Xe(40)-Ar(50)-Ne(10) |
| 34 | VAPOR DEPOSITION OF MgO BY IRRADIATING ION BEAM | | | 150 | (110)-FACE ORIENTATION | Xe(70)-Ar(10)-Ne(20) |

| | GAS | | PANEL | CHARACTERISTICS CHANGE RATE AFTER 7000 H, 150 V, 30 KHz | |
|---|---|---|---|---|---|
| EXAMPLE No. | CHARGING PRESSURE (Torr) | ULTRAVIOLET RAY WAVELENGTH | BRIGHTNESS (INITIAL VALUE) ($cd/m^2$) | PANEL BRIGHTNESS (%) | DISCHARGE MAINTENANCE VOLTAGE(%) |
| 16 | 500 | 173 nm BY MOLECULAR BEAM | 501 | −6.5 | 2.0 |
| 17 | 600 | 173 nm BY MOLECULAR BEAM | 505 | −5.2 | 1.9 |
| 18 | 550 | 173 nm BY MOLECULAR BEAM | 502 | −5.8 | 2.1 |
| 19 | " | 173 nm BY MOLECULAR BEAM | 498 | −6.0 | 2.2 |
| 20 | 650 | 173 nm BY MOLECULAR BEAM | 512 | −6.2 | 2.5 |
| 21 | 550 | 173 nm BY MOLECULAR BEAM | 516 | −7.1 | 2.2 |
| 22 | 590 | 173 nm BY MOLECULAR | 513 | −6.0 | 2.3 |

TABLE 3-continued

| | | | | | |
|---|---|---|---|---|---|
| | | BEAM | | | |
| 23 | 760 | 173 nm BY MOLECULAR BEAM | 495 | −4.2 | 2.4 |
| 24 | 600 | 173 nm BY MOLECULAR BEAM | 513 | −5.8 | 2.1 |
| 25 | 550 | 173 nm BY MOLECULAR BEAM | 508 | −5.9 | 2.3 |
| 26 | 520 | 173 nm BY MOLECULAR | 506 | −5.2 | 2.6 |
| 27 | 580 | 173 nm BY MOLECULAR BEAM | 518 | −5.0 | 2.5 |
| 28 | 610 | 173 nm BY MOLECULAR BEAM | 503 | 4.9 | 2.1 |
| 29 | 650 | 173 nm BY MOLECULAR BEAM | 521 | 4.5 | 2.4 |
| 30 | 700 | 173 nm BY MOLECULAR BEAM | 510 | −4.3 | 2.3 |
| 31 | 630 | 173 nm BY MOLECULAR BEAM | 508 | −4.7 | 2.2 |
| 32 | 500 | 173 nm BY MOLECULAR BEAM | 518 | −5.0 | 2.7 |
| 33 | 750 | 173 nm BY MOLECULAR BEAM | 511 | −4.4 | 2.6 |
| 34 | 590 | 173 nm BY MOLECULAR BEAM | 506 | −4.9 | 2.4 |

TABLE 4

| EXAMPLE No. | CVD SOURCE | BUBBLER TEMPERATURE (° C.) | HEATING TEMPERATURE FOR GLASS SUBSTRATE (° C.) | PROTECTING LAYER FORMING METHOD | Ar GAS FLOW RATE (l/min.) | $O_2$ GAS FLOW RATE (l/min.) | X-RAY ANALYSIS RESULT ALKALINE EARTH OXIDE |
|---|---|---|---|---|---|---|---|
| 35 | $Mg(C_{11}H_{19}O_2)_2$ | 125 | 350 | THERMAL CVD | 1 | 2 | MgO |
| 36 | " | " | 250 | PLASMA ENHANCED CVD | " | " | " |
| 37 | $Be(C_{11}H_{19}O_2)_2$ | 110 | 350 | THERMAL CVD | " | " | BeO |
| 38 | " | " | 250 | PLASMA ENHANCED CVD | " | " | " |
| 39 | $Ca(C_{11}H_{19}O_2)_2$ | 130 | 400 | THERMAL CVD | " | " | CaO |
| 40 | " | " | 300 | PLASMA ENHANCED CVD | " | " | " |
| 41 | $Sr(C_{11}H_{19}O_2)_2$ | 135 | 400 | THERMAL CVD | " | " | SrO |
| 42 | " | " | 300 | PLASMA ENHANCED CVD | " | " | " |
| 43 | $Ba(C_{11}H_{19}O_2)_2$ | 140 | 400 | THERMAL CVD | " | " | BaO |
| 44 | " | " | 300 | PLASMA ENHANCED CVD | " | " | " |
| 45 | $Mg(C_5H_7O)_2$ | 185 | 400 | THERMAL CVD | 1.5 | 2.5 | MgO |
| 46 | " | " | 300 | PLASMA ENHANCED CVD | " | " | " |
| 47 | $Be(C_5H_7O)_2$ | 150 | 400 | THERMAL CVD | 1.3 | 2.4 | BeO |
| 48 | $Ca(C_5H_7O)_2$ | 190 | 350 | " | 0.8 | 2.0 | CaO |
| 49 | $Sr(C_5H_7O)_2$ | 195 | " | " | " | " | SrO |
| 50 | $Ba(C_5H_7O)_2$ | 200 | 350 | " | 0.8 | 2 | BaO |
| 51 | $Mg(C_5F_5F_3O_2)_2$ | 115 | 450 | " | 0.5 | 1.5 | MgO |
| 52 | " | 115 | 350 | PLASMA ENHANCED CVD | " | " | " |
| 53 | $Be(C_5F_5F_3O_2)_2$ | 100 | 450 | THERMAL CVD | " | " | BaO |
| 54 | $Ca(C_5F_5F_3O_2)_2$ | 120 | " | " | " | " | CaO |
| 55 | $Sr(C_5F_5F_3O_2)_2$ | 125 | " | " | " | " | SrO |
| 56 | $Ba(C_5F_5F_3O_2)_2$ | 130 | " | " | " | " | BaO |
| 57 | $Mg(C_5H_5)_2$ | 80 | 350 | " | 1 | 2 | MgO |

TABLE 4-continued

| | | | | | | | |
|---|---|---|---|---|---|---|---|
| 58 | " | " | 250 | PLASMA ENHANCED CVD | " | " | " |
| 59 | $Be(C_2H_5)_2$ | 75 | 350 | THERMAL CVD | " | " | BaO |
| 60 | " | " | 250 | PLASMA ENHANCED CVD | " | " | " |
| 61 | $Ca(C_2H_5)_2$ | 90 | 350 | THERMAL CVD | " | " | CaO |
| 62 | " | " | 250 | PLASMA ENHANCED CVD | " | " | " |
| 63 | $Sr(C_2H_5)_2$ | 95 | 350 | THERMAL CVD | " | " | SrO |
| 64 | " | " | 250 | PLASMA ENHANCED CVD | " | " | " |
| 65 | $Ba(C_2H_5)_2$ | 98 | 350 | THERMAL CVD | " | " | BaO |
| 66 | " | " | 250 | PLASMA ENHANCED CVD | " | " | " |
| 67 | VAPORATE MgO BY IRADIATING ELECTRON BEAM | | 350 | VACUUM VAPOR DEPOSITION | — | — | MgO |
| 68 | SPUTTERING ON MgO | | " | SPUTTERING | — | — | " |
| 69 | SCREEN PRINTING ON MgO PASTE | | " | SCREEN PRINTING | — | — | " |

| | X-RAY ANALYSIS | ALKALINE EARTH OXIDE | | CHARACTERISTICS CHANGE RATE AFTER 7000 h, 150 V, 30 KHz | |
|---|---|---|---|---|---|
| EXAMPLE No. | RESULT CRYSTAL ORIENTATION | LAYER THICKNESS (μm) | DEPOSITION SPEED (μm/min.) | PANEL BRIGHTNESS (%) | DISCHARGE MAINTENANCE VOLTAGE(%) |
| 35 | (100)-FACE ORIENTATION | 1.0 | 1.0 | −9.5% | 2.5% |
| 36 | (100)-FACE ORIENTATION | 0.9 | 0.9 | −8.5% | 2.3% |
| 37 | (100)-FACE ORIENTATION | 0.8 | 0.8 | −10.2% | 2.9% |
| 38 | (100)-FACE ORIENTATION | 0.7 | 0.7 | −10.1% | 3.0% |
| 39 | (100)-FACE ORIENTATION | 1.0 | 1.0 | −9.4% | 2.5% |
| 40 | (100)-FACE ORIENTATION | 0.9 | 0.9 | −9.2% | 2.4% |
| 41 | (100)-FACE ORIENTATION | 0.7 | 0.7 | −9.3% | 2.6% |
| 42 | (100)-FACE ORIENTATION | 0.6 | 0.6 | −9.1% | 2.5% |
| 43 | (100)-FACE ORIENTATION | 0.8 | 0.8 | −9.1% | 2.7% |
| 44 | (100)-FACE ORIENTATION | 0.7 | 0.7 | −9.0% | 2.6% |
| 45 | (100)-FACE ORIENTATION | 0.6 | 0.6 | −8.5% | 2.5% |
| 46 | (100)-FACE ORIENTATION | 0.5 | 0.5 | −8.3% | 2.4% |
| 47 | (100)-FACE ORIENTATION | 0.8 | 0.8 | −8.5% | 2.7% |
| 48 | (100)-FACE ORIENTATION | 0.7 | 0.7 | −9.0% | 2.6% |
| 49 | (100)-FACE ORIENTATION | 0.8 | 0.8 | −9.2% | 2.4% |
| 50 | (100)-FACE ORIENTATION | 0.7 | 0.7 | −9.5% | 2.8% |
| 51 | (100)-FACE ORIENTATION | 0.7 | 0.7 | −8.8% | 2.3% |
| 52 | (100)-FACE ORIENTATION | 0.6 | 0.6 | −8.5% | 2.2% |
| 53 | (100)-FACE ORIENTATION | 0.8 | 0.8 | −8.5% | 2.5% |
| 54 | (100)-FACE ORIENTATION | 0.6 | 0.6 | −8.2% | 2.3% |
| 55 | (100)-FACE ORIENTATION | 0.5 | 0.5 | −9.3% | 2.8% |
| 56 | (100)-FACE ORIENTATION | 0.4 | 0.4 | −8.8% | 2.2% |
| 57 | (100)-FACE ORIENTATION | 1.1 | 1.1 | −7.5% | 2.0% |
| 58 | (100)-FACE ORIENTATION | 0.9 | 0.9 | −7.1% | 2.0% |
| 59 | (100)-FACE ORIENTATION | 1.2 | 1.2 | −7.0% | 2.1% |

TABLE 4-continued

| | | | | | |
|---|---|---|---|---|---|
| 60 | (100)-FACE ORIENTATION | 1.0 | 1.0 | −6.9% | 2.0% |
| 61 | (100)-FACE ORIENTATION | 0.9 | 0.9 | −8.2% | 2.6% |
| 62 | (100)-FACE ORIENTATION | 0.8 | 0.8 | −8.3% | 2.7% |
| 63 | (100)-FACE ORIENTATION | 0.8 | 0.8 | −8.9% | 2.5% |
| 64 | (100)-FACE ORIENTATION | 0.7 | 0.7 | −9.0% | 2.8% |
| 65 | (100)-face ORIENTATION | 0.9 | 0.9 | −8.0% | 2.2% |
| 66 | (100)-FACE ORIENTATION | 0.7 | 0.7 | −8.0% | 2.1% |
| 67 | (111)-FACE ORIENTATION | 0.8 | 0.8 | −15.2% | 8.5% |
| 68 | (100)-FACE ORIENTATION | 0.5 | 0.1 | −10.2% | 6.5% |
| 69 | (111)-FACE ORIENTATION | 1.0 | — | −25.1% | 10.8% |

What is claimed is:

[1. A method of producing a PDP, the method comprising:

a first step of forming a front cover plate by forming a first electrode and a dielectric glass layer on a front glass substrate then forming a protecting layer of an alkaline earth oxide with one of (100)-face orientation and (110)-face orientation on the dielectric glass layer; and a second step of forming a back plate by forming a second electrode and a fluorescent substance layer on a back glass substrate then bonding the front cover plate, on which the protecting layer has been formed, with the back plate, and charging a gas medium into a plurality of discharge spaces which are formed between the front cover plate and the back plate, the front cover plate and the back plate facing to each other.]

[2. The method of producing a PDP of claim 1, wherein in the first step, the protecting layer is formed with one of a thermal Chemical Vapor Deposition method and a plasma Chemical Vapor Deposition method by using an alkaline earth organometallic compound and oxygen.]

[3. The method of producing a PDP of claim 2, wherein the alkaline earth organometallic compound used in the first step is one of an alkaline earth metal chelate compound and an alkaline earth cyclopentadienyl compound.]

[4. The method of producing a PDP of claim 3, wherein the alkaline earth organometallic compound used in the first step is one of $M(C_{11}H_{19}O_2)_2$, $M(C_5H_7O_2)_2$, $M(C_5H_5F_3O_2)_2$, and $M(C_5H_5)_2$, wherein M represents one of magnesium, beryllium, calcium, strontium, and barium.]

[5. A method of producing a plasma display panel having a plurality of discharge space cells with a front substrate and a rear substrate and walls separating each cell, each discharge space is addressable by display electrodes to cause the cell to emit light comprising:

depositing a protective layer of an alkaline earth oxide having one of a (100) crystal face orientation and a (110) crystal face orientation extending across a top surface of each cell; and charging each cell with a discharge gas.]

[6. The plasma display panel method of claim 5 wherein each cell is pressurized to pressure of approximately 500 to 760 Torrs.]

[7. The plasma display panel method of claim 6 wherein each cell is charged with an xenon discharge gas between 10% by volume to approximately 100% by volume.]

[8. The plasma display panel method of claim 7 wherein one of argon, kryptor, helium and neon is mixed with the xenon.]

[9. The plasma display panel method of claim 7 wherein one of argon and krypton is mixed with the xenon in sufficient volume to provide ultraviolet light emission at a wavelength of 173 nm.]

[10. The plasma display panel method of claim 7 wherein two additional discharge gases within the range of 10% to 50% by volume are mixed with the xenon.]

[11. The plasma display panel method of claim 6 wherein a distance between adjacent display electrodes in the same plane is no greater than 0.1 mm.]

[12. The plasma display panel method of claim 5 wherein the protective layer is selected from a group consisting of MgO, BeO, CaO, SrO and BaO.]

[13. The plasma display panel method of claim 5 wherein the protective layer is magnesium oxide with a crystal face orientation of(110).]

[14. The plasma display panel method of claim 5, wherein the first substrate includes a dielectric glass layer and the dielectric glass layer is heated to a temperature between 350° C. to 400° c. during the depositing of the protective layer by a thermal chemical vapor deposition.]

[15. The plasma display panel method of claim 5, wherein the front substrate includes a dielectric glass layer and the dielectric glass layer is heated to a temperature between 250° C. to 300° C. during the depositing of the protective layer by a plasma enhanced chemical vapor deposition.]

[16. The plasma display panel method of claim 5, wherein the front substrate includes an upper glass plate and a lower dielectric glass layer, and display electrodes are formed from depositing a conductive paste on the upper glass plate, the paste is then baked to harden it and subsequently is sandwiched with the lower dielectric glass layer.]

[17. The plasma display panel method of claim 5, wherein the protective layer is deposited by transferring a paste of the alkaline earth oxide to the front substrate and baking it.]

[18. The plasma display panel method of claim 17, wherein the paste is a magnesium salt with a plate-shaped crystal structure.]

[19. The plasma display panel method of claim 18, wherein the paste is magnesium oxalate formed by dissolving ammonium oxalate in a magnesium chloride aqueous solution and heating it to form the plate-shaped crystal structure.]

[20. The plasma display panel method of claim 5, wherein the depositing of the protective layer is made by evaporating the alkaline earth oxide with an ion/electron beam in a vacuum.]

[21. A method of producing a plasma display panel having a plurality of discharge space cells, each discharge space cell is addressable by display electrodes to cause the cells to emit light, comprising:

depositing a protective layer of an alkaline earth compound selected from the group consisting of $M(C_{11}H_{19}O_2)_2$, $M(C_5H_7O_2)_2$, $M(C_5H_5F_3O_2)_2$, and $M(C_5H_5)_2$, wherein M represents one of magnesium, beryllium, calcium, strontium, and barium, the protective layer having one of a (100) crystal-face orientation and a (110) crystal-face orientation extending across a surface of each cell; and charging each cell with a discharge gas.]

[22. The plasma display method of claim 21, wherein the protective layer is deposited by one of a thermal chemical vapor deposition step and a plasma enhanced chemical vapor deposition step.]

[23. The plasma display method of claim 22, wherein the discharge gas includes at least 10% by volume Xe and is at a pressure of at least 500 Torr.]

[24. The plasma display method of claim 23, wherein the discharge gas includes one of Ar and Kr.]

[25. The plasma display method of claim 23 wherein the discharge gas is selected from a group consisting of Ar-He-Xe, Ar-He-Xe, Kr-Ne-Xe, and Kr-He-Xe and the amount of Kr, Ar, He, or Ne should be in the range of 10% to 50% by volume.]

[26. The plasma display method of claim 23, wherein the alkaline earth compound is selected from the croup consisting of magnesium dipivaloyl methane, magnesium acetylacetone, magnesium trifluoroacetylacetone, and cyclopentadienyl.]

[27. A method of producing a plasma display panel having a plurality of discharge space cells, each discharge space cell is addressable by display electrodes to cause the cell to emit light, comprising:

depositing a protective layer selected from the group consisting of magnesium dipivaloyl methane, magnesium acetylacetone, magnesium trifluoroacetylacetone, and cyclopentadienyl magnesium across a surface of each cell to provide one of a (100) crystal-face orientation and a (110) crystal-face orientation; and charging each cell with a discharge gas including at least 10% by volume Xe at a pressure of at least 500 Torr.]

*28. A production method of a plasma display panel, comprising:*

*a step for forming a dielectrics layer on a substrate; and*

*a step for, after the dielectrics layer forming step, generating crystals of magnesium oxide having (100)-face orientation by heating a magnesium salt.*

*29. The production method of claim 28, wherein*

*the magnesium salt is either magnesium oxalate, magnesium carbonate, or magnesium hydroxide.*

*30. A plasma display panel, comprising:*

*a dielectrics layer formed on a substrate; and*

*on the dielectrics layer, crystals of magnesium oxide having (100)-face orientation generated by heating a magnesium salt.*

*31. In a plasma display panel having a dielectric layer in each discharge space cell, the improvement comprising:*

*crystals of magnesium oxide having (100)-face orientation are provided on the dielectric layer in each discharge space cell.*

* * * * *